(12) United States Patent
Morishita et al.

(10) Patent No.: US 8,188,534 B2
(45) Date of Patent: *May 29, 2012

(54) SEMICONDUCTOR MEMORY DEVICE

(75) Inventors: Fukashi Morishita, Tokyo (JP);
Kazutami Arimoto, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/022,864

(22) Filed: Feb. 8, 2011

(65) Prior Publication Data

US 2011/0127609 A1 Jun. 2, 2011

Related U.S. Application Data

(63) Continuation of application No. 10/593,275, filed as application No. PCT/JP2005/010242 on Jun. 3, 2005, now Pat. No. 7,910,975.

(30) Foreign Application Priority Data

Jun. 9, 2004 (JP) ................................ 2004-170920

(51) Int. Cl.
  *H01L 29/788* (2006.01)
  *H01L 27/01* (2006.01)
  *H01L 27/12* (2006.01)
(52) U.S. Cl. ........................................ 257/316; 257/347
(58) Field of Classification Search .......... 257/314–326, 257/E29.129, E29.3
See application file for complete search history.

(56) References Cited

U.S. PATENT DOCUMENTS

| | | | |
|---|---|---|---|
| 5,767,549 A | 6/1998 | Chen et al. | |
| 5,912,842 A | 6/1999 | Chang et al. | |
| 6,204,534 B1 | 3/2001 | Adan | |
| 6,650,565 B1 | 11/2003 | Ohsawa | |
| 6,794,717 B2 | 9/2004 | Matsumoto et al. | |
| 7,098,499 B2 * | 8/2006 | Wang | 257/315 |
| 7,372,734 B2 * | 5/2008 | Wang | 257/374 |
| 7,700,993 B2 * | 4/2010 | Cai et al. | 257/315 |
| 2002/0109187 A1 | 8/2002 | Matsumoto et al. | |
| 2002/0114191 A1 | 8/2002 | Iwata et al. | |

(Continued)

FOREIGN PATENT DOCUMENTS

CN 1218294 A 6/1999
(Continued)

OTHER PUBLICATIONS

Kuo, C., et al. "A Capacitorless Double Gate DRAM Technology for Sub-100-nm Embedded and Stand-Alone Memory Applications" IEEE Transactions of Electron Devices, Dec. 2003, vol. 50, No. 12, pp. 2408-2416.

(Continued)

*Primary Examiner* — Cuong Q Nguyen
(74) *Attorney, Agent, or Firm* — McDermott Will & Emery LLP

(57) ABSTRACT

The present invention aims at providing a semiconductor memory device that can be manufactured by a MOS process and can realize a stable operation. A storage transistor has impurity diffusion regions, a channel formation region, a charge accumulation node, a gate oxide film, and a gate electrode. The gate electrode is connected to a gate line and the impurity diffusion region is connected to a source line. The storage transistor creates a state where holes are accumulated in the charge accumulation node and a state where the holes are not accumulated in the charge accumulation node to thereby store data "1" and data "0", respectively. An access transistor has impurity diffusion regions, a channel formation region, a gate oxide film, and a gate electrode. The impurity diffusion region is connected to a bit line.

3 Claims, 27 Drawing Sheets

U.S. PATENT DOCUMENTS

2003/0161184 A1     8/2003    Lee et al.

FOREIGN PATENT DOCUMENTS

| CN | 1371132 A   | 9/2002 |
| CN | 1490820 A   | 4/2004 |
| JP | 10-209456   | 8/1998 |
| JP | 2002-260381 | 9/2002 |
| JP | 2003-86712  | 3/2003 |

OTHER PUBLICATIONS

Kuo, C., et al. "A Capacitorless Double Gate Cell" IEEE Electron Device Letters, Jun. 2002, vol. 23, No. 6, pp. 345-347.

Ohsawa, T., et al. "Memory Design Using One-Transistor Gain Cell on SOI" Digest of Technical Papers, IEEE International Solid-State Circuits Conference, Feb. 5, 2002, pp. 152-153, 454-455.

Chinese Office Action, with English translation thereof, issued in Patent Application No. 2005800183321 dated on Aug. 1, 2008.

Korean Office Action, w/ partial English translation thereof, issued in Korean Patent Application No. KR 10-2006-7017509 dated Jul. 28, 2011.

Korean Office Action, with full Japanese translation and partial English translation, issued in Korean Patent Application No. 10-2006-7017509 dated Jan. 4, 2012.

* cited by examiner

F I G . 6
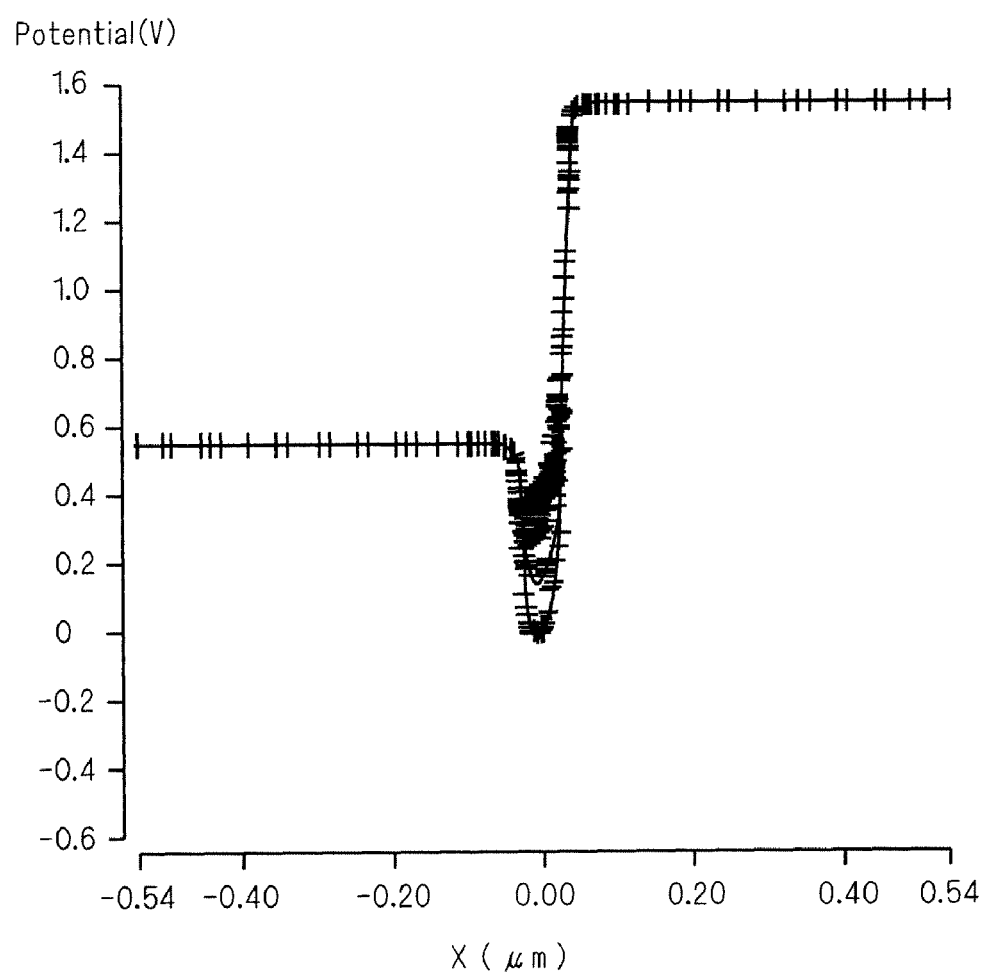

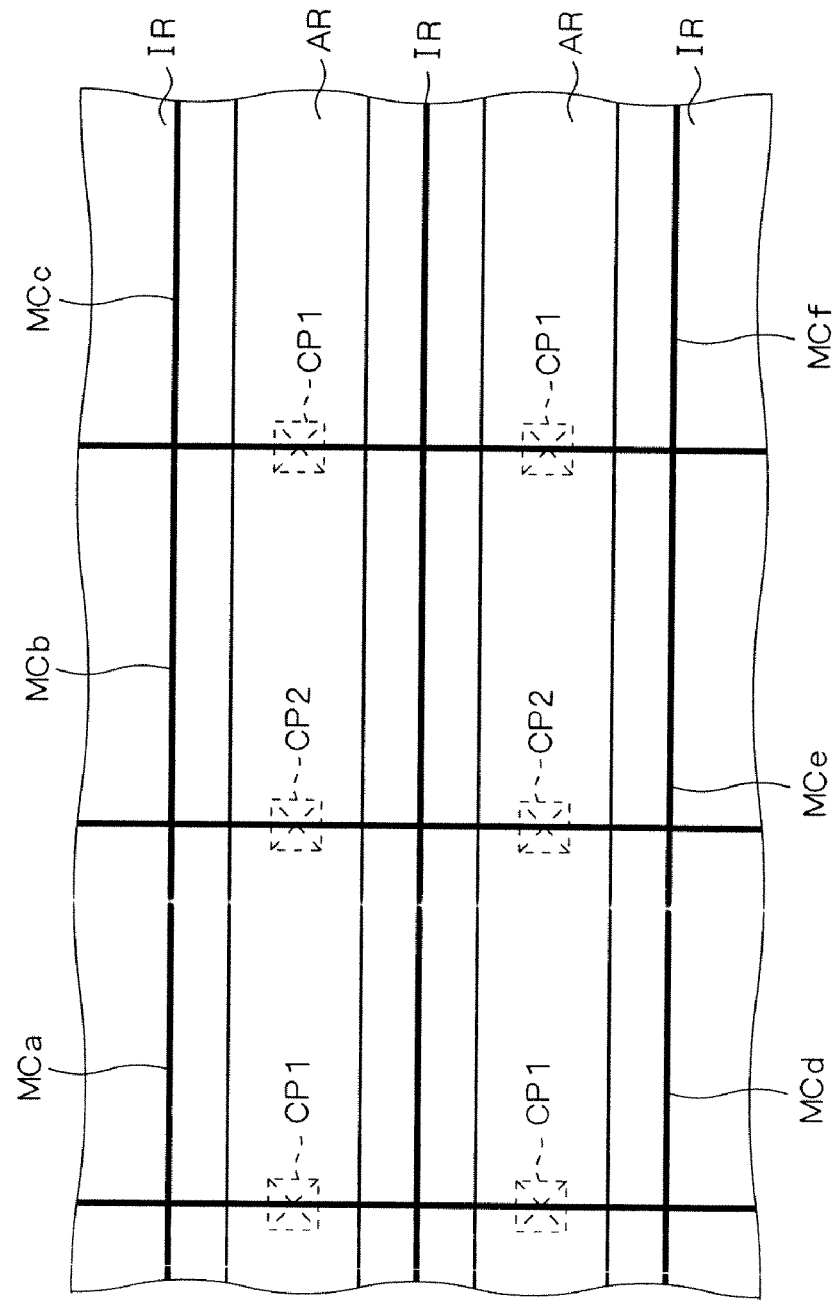

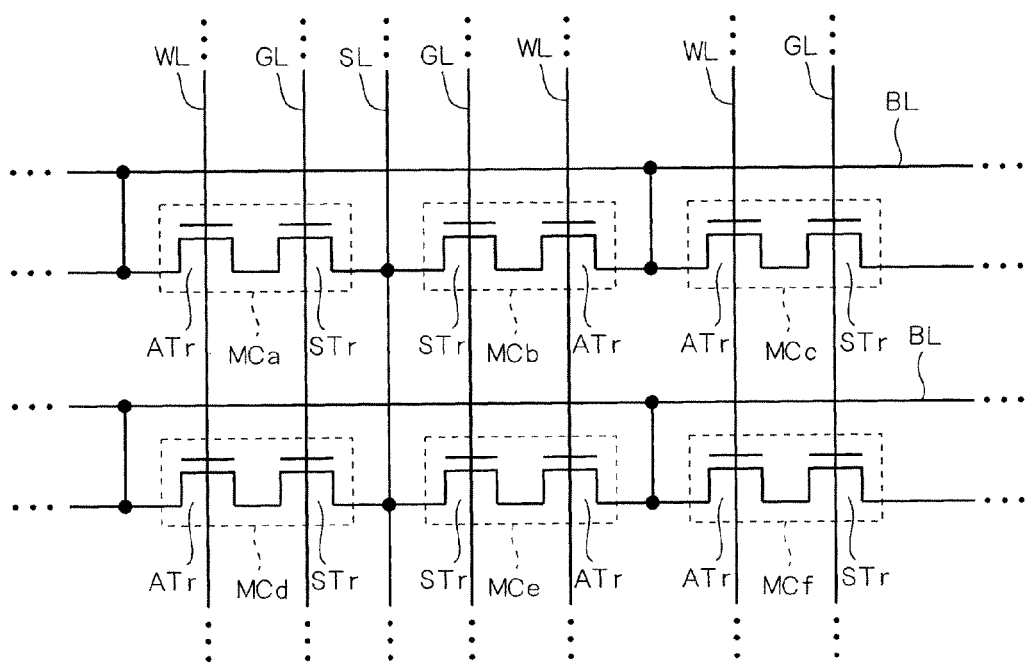
F I G . 1 9

SEMICONDUCTOR MEMORY DEVICE

RELATED APPLICATIONS

This application is a Continuation of U.S. patent application Ser. No. 10/593,275, filed on Sep. 18, 2006 now U.S. Pat. No. 7,910,975, which is a U.S. National Phase under 35 U.S.C. §371 of International Application No. PCT/JP2005/010242, filed on Jun. 3, 2005, which in turn claims the benefit of Japanese Application No. 2004-170920, titled on Jun. 9, 2004, the disclosures of which Applications are incorporated by reference herein.

TECHNICAL FIELD

The present invention relates to a semiconductor memory device, and particularly to a semiconductor memory device in which a memory cell is constituted by two transistors.

BACKGROUND ART

A DRAM having a stack-type or trench-type memory capacitor and a MOS transistor for switching is mainly used as a semiconductor memory device with a high density. However, further miniaturization of the memory capacitor is difficult, and therefore miniaturization of the DRAM is also going to show a limitation. Under such a circumstance, a semiconductor memory device is being developed, which is of a type constituting a memory cell by only one memory transistor by concurrently using a switching transistor as a capacitor element instead of using the aforementioned stack-type or trench-type memory capacitor. For example, Non-Patent Document 1 as described below discloses a semiconductor memory device in which electric charges are accumulated in a floating body region of an SOI transistor.

Non-Patent Document 1: DIGEST OF TECHNICAL PAPERS pp 152-153, "9.1 Memory Design Using One-Transistor Gain Cell on SOI", Takashi Ohsawa, Katsuyuki Fujita, Tomoki Higashi, Yoshihisa Iwata, Takeshi Kajiyama, Yoshiaki Asano, Kazumasa Sunouchi, 2002 IEEE International Solid-State Circuits Conference, Feb. 5, 2002.

Also, similarly to Non-Patent Document 1, Patent Document 1 discloses another example of a semiconductor memory device in which a memory cell is constituted by only one transistor.

Patent Document 1: Japanese Patent Application Laid-Open No. 2002-260381.

However, according to the semiconductor memory device disclosed in Patent Document 1, a polysilicon pillar of a special structure needs to be formed, thereby making a process complicated and inviting an increase of a cost.

In the semiconductor memory device disclosed in Patent Document 1, by applying a high voltage between a source and a drain, impact ionization is caused in the vicinity of the drain, and holes generated thereby are accumulated in a body. Thus, writing of data "1" (in a state of low threshold voltage) is carried out. Moreover, by discharging holes from the body by applying a negative voltage to the source, writing of data "0" (in a state of high threshold voltage) is carried out. However, there is a limit in generating holes by impact ionization, thereby involving a problem that a difference of a threshold voltage can not be increased between the state of data "1" and the state of data "0". Further, significantly various kind of power supply voltages are required for controlling reading and writing, and in addition, a driver for supplying voltages of 3 values are required for controlling a word line and a bit line, thereby also involving the problem that control of the reading and writing and generation of required voltage are complicated. Further, when the memory cell is constituted by only one memory transistor, in some cases, a potential of the body is maintained in a low state when power is input. In such a state, current does not flow by impact ionization, thus involving a problem that writing of data "1" can not be performed. In order to prevent such a situation, there is a problem that an extra procedure is required such that all memory cells are once initialized, thereby requiring higher power supply voltage than normal operation for initialization.

DISCLOSURE OF THE INVENTION

In order to solve the above-described problems, the present invention is provided, and an object of the present invention is to obtain a semiconductor memory device capable of being manufactured by a widely used MOS process without requiring a special process and realizing a stable operation by greatly differentiating a threshold voltage between a state of data "1" and a state of data "0".

According to a first aspect of the present invention, a semiconductor memory device includes a plurality of memory cells arranged in a matrix, a gate line and a word line shared by the plurality of memory cells arranged in a first direction, and a bit line and a source line shared by the plurality of memory cells arranged in a second direction. Herein, each of the plurality of memory cells includes a storage transistor having first and second impurity diffusion regions opposed to each other through a first channel formation region, a first gate electrode formed above the first channel formation region, and a charge accumulation node formed below the first channel formation region, and an access transistor connected to the storage transistor in series, having the first impurity diffusion region, a third impurity diffusion region opposed to the first impurity diffusion region through a second channel formation region, and a second gate electrode formed above the second channel formation region. The second impurity diffusion region is connected to the source line, the third impurity diffusion region is connected to the bit line, the first gate electrode is connected to the gate line, and the second gate electrode is connected to the word line. By turning on/off the access transistor, a potential of the first impurity diffusion region is switched to a fixed potential or a floating state, to thereby control the potential of the charge accumulation node, and a threshold voltage of the storage transistor is thereby set at high level or low level.

According to the first aspect of the semiconductor memory device of the present invention, it can be manufactured without requiring a special process, and a stable operation can be realized.

According to a second aspect of the present invention, a semiconductor memory device has a main surface formed with a first element isolation film extending along a first direction, and includes a substrate with an element formation region extending along the first direction defined by the first element isolation film, a bit line extending in the first direction, a plurality of gate lines, a plurality of word lines, and a plurality of source lines extending along a second direction respectively, and a plurality of memory cells arranged alongside in the first direction in the element formation region. Herein, the bit line is shared by the plurality of memory cells. One of the plurality of source lines is shared by two memory cells adjacent to each other along the first direction out of the plurality of memory cells.

According to the second aspect of the semiconductor memory device of the present invention, an area of a memory cell array region can be decreased.

BRIEF DESCRIPTION OF THE DRAWINGS

FIG. 6 is a view showing a result of simulating the change of potential of a storage node when a gate line is raised to high level from low level.

FIG. 18 is a top view showing the upper surface layout of the semiconductor memory device according to Embodiment 4 of the present invention.

FIG. 19 is an equivalent circuit diagram corresponding to the layout shown in FIG. 16.

DESCRIPTION OF THE SYMBOLS

1: Semiconductor memory device, 8: Memory array, 9: Sense amplifier 11: Silicon substrate, 12: Buried oxide layer, 13: Silicon layer, 14: SOI substrate, 20, 22, 24, 58, 60, 62: Impurity diffusion region, 16, 18, 54, 56: Gate oxide film, 17, 19, 55, 57: Gate electrode, 21, 23a, 59, 61a: Channel formation region, 23b, 61b: Charge accumulation node, 50: P-type silicon substrate, 51: N well, 52: P well, STr: Storage transistor, ATr: Access transistor, SN: Storage node, MC, MCH, MCL: Memory cell, BL: Bit line, RBLH, RBLL: Reference bit line, SL: Source line, GL: Gate line, WL: Word line, Tr1, Tr2: Transistor

BEST MODE CARRYING OUT THE INVENTION

Embodiment 1

Figure 1:
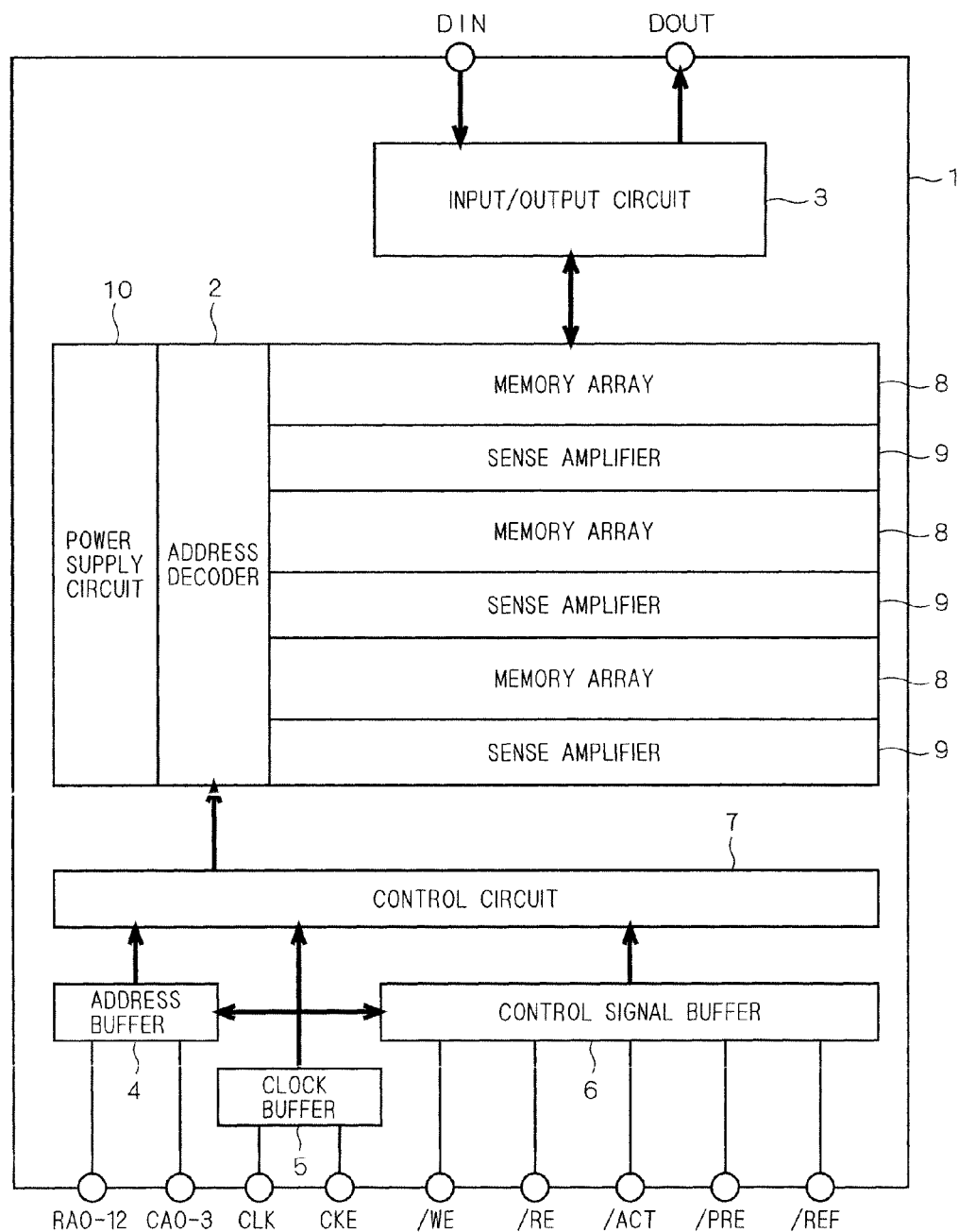
FIG. 1 is a block diagram showing an entire structure of a semiconductor memory device according to Embodiment 1 of the present invention.

FIG. 1 is a block diagram showing an entire structure of a semiconductor memory device 1 according to Embodiment 1 of the present invention. With reference to FIG. 1, the semiconductor memory device 1 includes an address decoder 2, an input/output circuit 3, an address buffer 4, a clock buffer 5, a control signal buffer 6, a control circuit 7, a memory array 8, a sense amplifier 9, and a power supply circuit 10.

Figure 2:
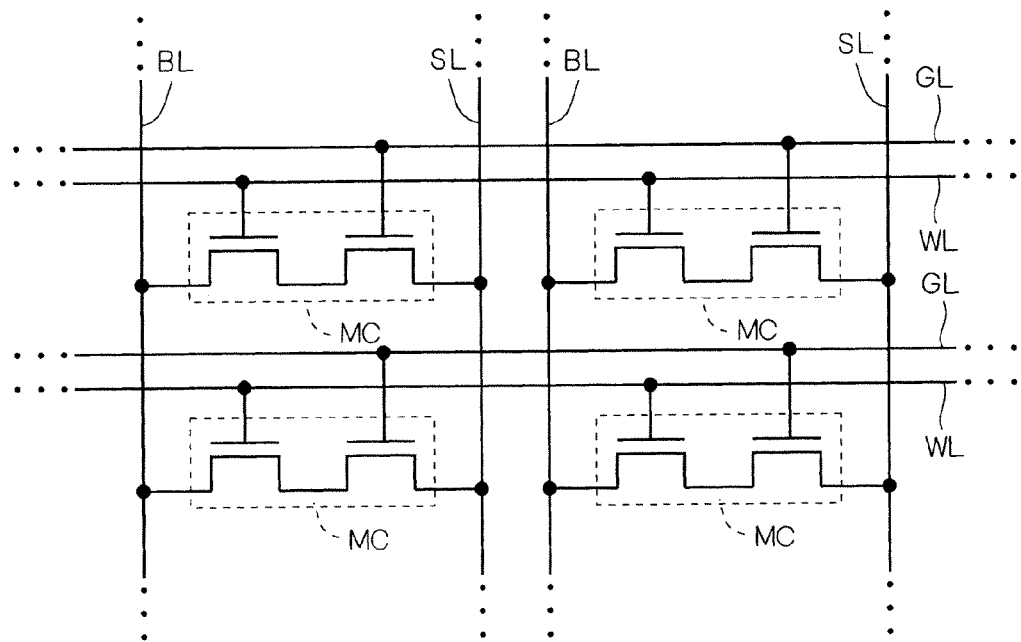
FIG. 2 is a circuit diagram extracting and showing a part of a memory cell array shown in FIG. 1.

FIG. 2 is a circuit diagram extracting and showing a part of the memory array 8 shown in FIG. 1. With reference to FIG. 2, a plurality of memory cells MC are arranged in a matrix in the memory array 8. Also, a plurality of gate lines GL and a plurality of word lines WL extending along a row direction and a plurality of bit lines BL and a plurality of source lines SL extending in a column direction are arranged in the memory array 8. By the plurality of memory cells MC arranged in the row direction, the gate lines GL and the word lines WL are shared, and by the plurality of memory cells MC arranged in the column direction, the bit lines BL and the source lines SL are shared. The memory cells MC are arranged at a cross point of the gate lines GL and the word lines WL, and the bit lines BL and the source lines SL.

With reference to FIG. 1, the address decoder 2 has a row address decoder and a column address decoder. Based on a row address signal supplied from the address buffer 4, the row address decoder selects and drives one word line WL and gate line GL respectively from the plurality of word lines WL and the plurality of gate lines GL. Based on a column address signal supplied from the address buffer 4, the column address decoder selects and drives one bit line BL from the plurality of bit lines BL.

The sense amplifier 9 has a plurality of sense amplifier circuits provided for each column of the memory array 8. The structure and operation of the sense amplifier circuit will be explained later.

In a data output operation, the input/output circuit 3 performs output of the sense amplifier circuit selected by the column address decoder, to outside the semiconductor memory device 1, as output data. Also, in a data input operation, the input/output circuit 3 writes input data in the memory cell MC via the bit line BL selected by the column address decoder, after the input data supplied from outside the semiconductor memory device 1 is amplified.

The address buffer 4, the clock buffer 5, and the control signal buffer 6 transmits to the control circuit 7 an address signal, a clock signal, and a control signal supplied from outside the semiconductor memory device 1, respectively.

The power supply circuit 10 generates a voltage (such as a voltage for applying to the word line WL and the bit line BL) required for operating the semiconductor memory device 1 such as reading and writing, and supplies it to the memory array 8, etc.

Figure 3:
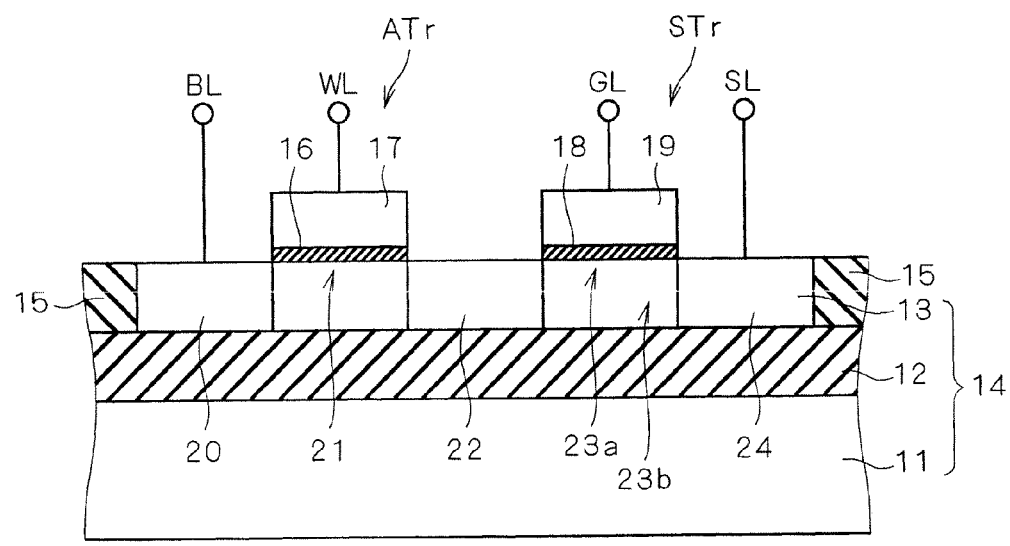
FIG. 3 is a sectional view showing a structure of a memory cell.
Figure 4:
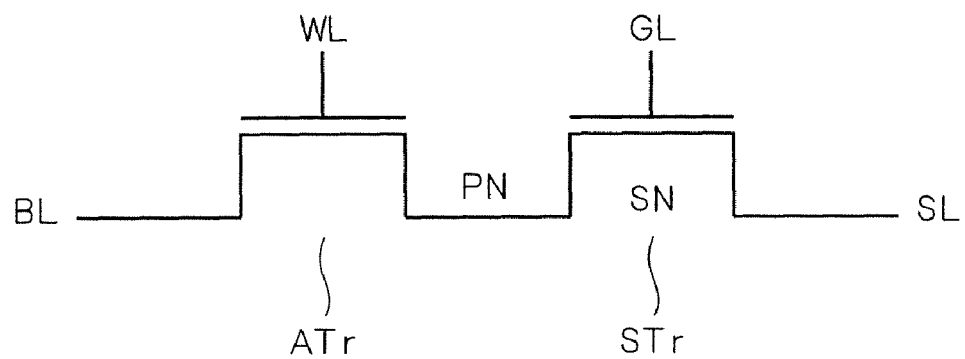
FIG. 4 is an equivalent circuit diagram of the memory cell.

FIG. 3 is a sectional view showing the structure of the memory cell MC, and FIG. 4 is an equivalent circuit view of the memory cell MC. With reference to FIG. 4, the memory cell MC has the structure in which a storage transistor STr having a storage node SN, and an access transistor ATr are connected in series via the node PN. Specifically, one memory cell MC is constituted by two transistors.

With reference to FIG. 3, an SOI substrate 14 has the structure in which a silicon substrate 11, a buried oxide film layer 12, and a silicon layer 13 are laminated in this order. The storage transistor STr has N-type impurity diffusion regions 22 and 24, a channel formation region 23a, a charge accumulation node 23b, a gate oxide film 18, and a gate electrode 19. The impurity diffusion regions 22 and 24 are formed so as to reach the upper surface of the buried oxide film layer 12 from the upper side of the silicon layer 13, and are opposed to each other through the channel formation region 23a defined in the upper surface of the silicon layer 13. The impurity diffusion region 22 corresponds to the node PN shown in FIG. 4. The gate oxide film 18 is formed on the channel formation region 23a, and the gate electrode 19 is formed on the gate oxide film 18. The charge accumulation node 23b corresponding to the storage node SN shown in FIG. 4 is formed below the channel formation region 23a. The charge accumulation node 23b is electrically separated from another adjacent memory cell MC by the element isolation film 15. Namely, the charge accumulation node 23b is constituted by the floating body of the SOI transistor. The gate electrode 19 is connected to the gate line GL, and the impurity diffusion region 24 is connected to the source line SL.

The storage transistor STr stores data "1" and data "0", by creating a state in which holes are accumulated in the charge accumulation node 23b (in a state of a low threshold voltage of the storage transistor STr) and a state in which the holes are not accumulated (in a state of high threshold voltage).

The access transistor ATr has N-type impurity diffusion regions 20 and 22, a channel formation region 21, a gate oxide film 16, and a gate electrode 17. The impurity diffusion region 20 is formed so as to reach the upper surface of the buried oxide film layer 12 from the upper surface of the silicon layer 13, and is opposed to the impurity diffusion region 22 through the channel formation region 21 defined in the upper surface of the silicon layer 13. The gate oxide film 16 is formed on the channel formation region 21, and the gate electrode 17 is formed on the gate oxide film 16. The gate electrode 17 is connected to the word line WL, and the impurity diffusion region 20 is connected to the bit line BL.

Figure 5:
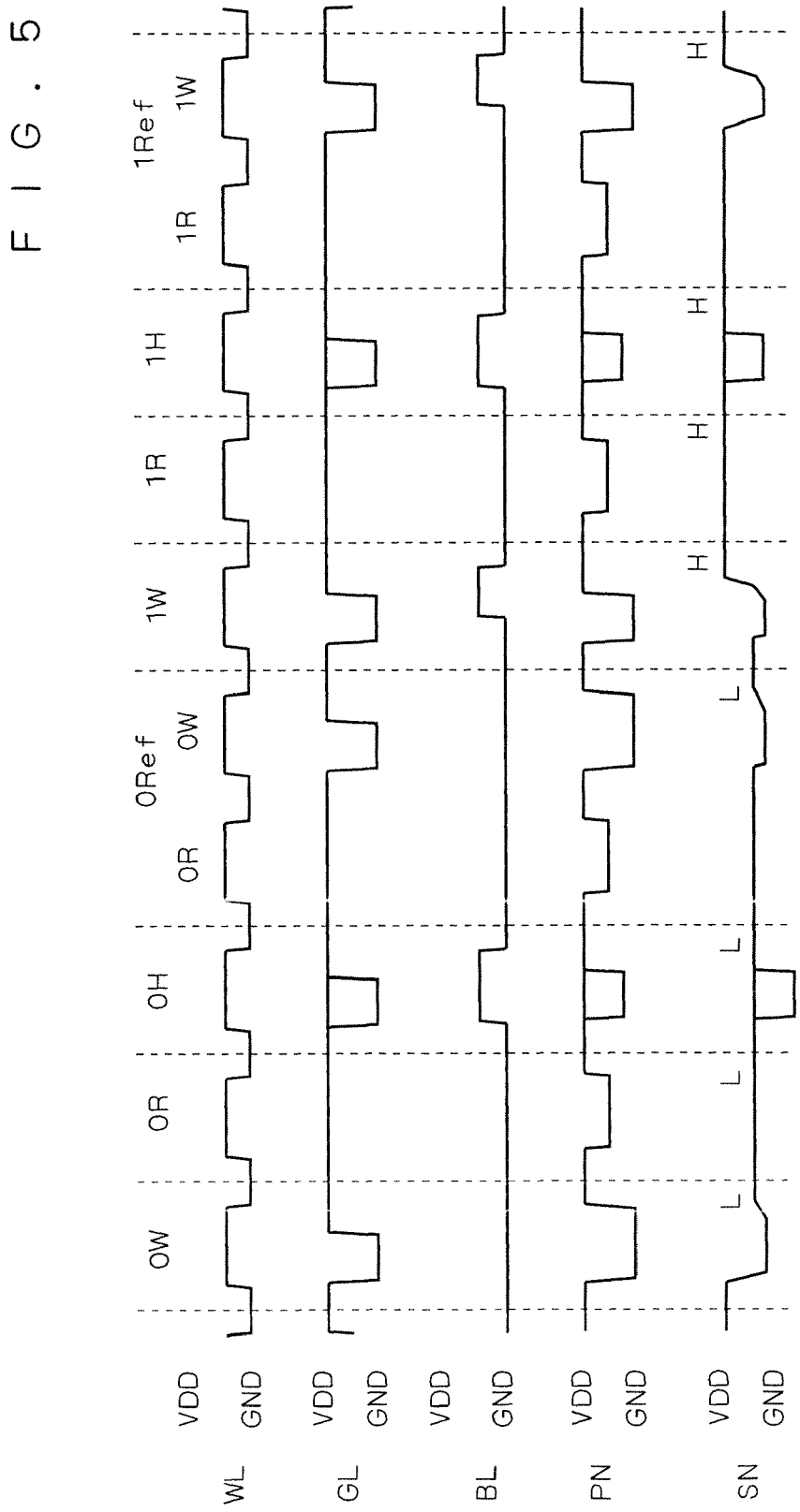
FIG. 5 is a timing chart for explaining an operation of the semiconductor memory device.

FIG. 5 is a timing chart for explaining the operation of the semiconductor memory device 1. Eight operation modes exist in total, and an explanation will be given later in sequence. Note that a power supply potential VDD is supplied to the source line SL.

(1) Write Operation of Data "0" (0W)

The word line WL is raised to high level (1/2 VDD) from low level (GND), with the bit line BL set at low level (GND), and the gate line GL is lowered to low level (GND) from high level (VDD). Thus, the node PN is lowered to low level (GND) from high level (VDD), the storage node SN is lowered to low level (GND) from high level (VDD) by gate coupling (capacitance coupling generated between gate and body). As a result, the state in which the holes are not accumulated in the storage node SN (data "0") is created.

Next, the gate line GL is raised to high level from low level, with the bit line BL maintained at the low level. At this time, the bit line BL is low level, and the word line WL is high level, and therefore the access transistor ATr is turned on, and the node PN is maintained at low level. Accordingly, when the potential of the gate line GL is slightly raised and a channel is formed in the storage transistor STr, the gate coupling is inhibited by the channel (channel block), and even when the potential of the gate line GL is raised, the potential of the storage node SN is not raised any more. That is, the holes supplied from the source line SL to the node PN via the storage transistor STr is discharged to the bit line BL via the access transistor ATr, and the state in which the holes are not accumulated in the storage node SN (data "0") is maintained.

Thereafter, by lowering the word line WL from high level to low level, the access transistor ATr is turned off, and the node PN is raised from low level to high level.

(2) Read Operation of Data "0" (0R)

By setting the bit line BL at low level and setting the word line WL at high level, the access transistor ATr is turned on. In this state, the gate line GL is set at high level. In the state in which the holes are not accumulated in the storage node SN (data "0"), the threshold voltage of the storage transistor STr becomes high. Therefore, an amount of a current flowing to the bit line BL from the source line SL via the storage transistor STr and the access transistor ATr is small.

The potential of the node PN is slightly decreased by turning on the access transistor ATr. However, when the word line WL is lowered to low level and the access transistor ATr is turned off thereafter, the potential of the node PN is raised to high level again.

(3) Holding Operation of Data "0" (0H)

The bit line BL is raised from low level to high level (1/2 VDD). Thus, even if the word line WL is set at high level, a potential difference is not generated between the bit line BL and the word line WL, and therefore the access transistor ATr is not turned on. Accordingly, the current does not flow to the bit line BL from the source line SL, and the data "0" is held.

(4) Refresh Operation of Data "0" (0Ref)

Twice period as much as normal command such as writing and reading is required for performing a refresh operation. First, the aforementioned read operation is performed to a refresh object memory cell MC, and the data "0" obtained as a result is stored in a write buffer provided in the input/output circuit 3 shown in FIG. 1. Thereafter, the aforementioned writing operation is carried out, and the same data (i.e., data "0") as the data stored in the write buffer is written in the refresh object memory cell MC.

(5) Write Operation of Data "1" (1W)

The word line WL is raised to high level from low level, with the bit line BL set at low level, and the gate line GL is lowered to low level from high level. Thus, the node PN is lowered to low level from high level, and the storage node SN is lowered to low level from high level by gate coupling. As a result, the state in which the holes are not accumulated in the storage node SN (data "0") is created. The operation heretofore is the same as the write operation of the data "0".

Next, after the bit line BL is raised to high level from low level, the gate line GL is raised to high level from low level. At this time, since both of the bit line BL and the word line WL are set at high level, the access transistor ATr is turned off, and the potential of the node PN is in the floating state. In this state, even if the gate line GL is raised, the channel is not formed in the storage transistor STr, and therefore the aforementioned channel block does not occur. Accordingly, when the potential of the gate line GL is raised, the potential of the storage node SN is also raised by gate coupling. Namely, the holes supplied to the storage node SN from the source line SL are not discharged to the bit line BL but accumulated in the storage node SN, thereby creating the state of data "1". Also, the potential of the node PN in the floating state is boosted to high level from low level by linking to the boosting of the potential of the storage node SN.

(6) Read Operation of Data "1" (1R)

By setting the bit line BL at low level and setting the word line WL at high level, the access transistor ATr is turned on. In this state, the gate line GL is set at high level. The threshold voltage of the storage transistor STr is lowered in the state in which the holes are accumulated in the storage node SN (data "1"). Therefore, the amount of the current flowing to the bit line BL from the source line SL via the storage transistor STr and the access transistor ATr is large.

(7) Holding Operation of Data "1" (1H)

In the same way as a holding operation of the data "0", the bit line BL is raised to high level from low level. Thus, even if the word line WL is high level, the potential difference is not generated between the bit line BL and the word line WL, and therefore the access transistor ATr is not turned on. Accordingly, the current does not flow to the bit line BL from the source line SL, and the data "1" is held.

(8) Refresh Operation of Data "1" (1Ref)

In the same way as the refresh operation of the data "0", first, the aforementioned read operation is performed to the refresh object memory cell MC, and the data "1" obtained as a result is stored in the write buffer provided in the input/output circuit 3 shown in FIG. 1. Thereafter, the aforementioned write operation is performed, and the same data as the data stored in the write buffer (i.e., data "1") is written in the refresh object memory cell MC.

Figure 7:
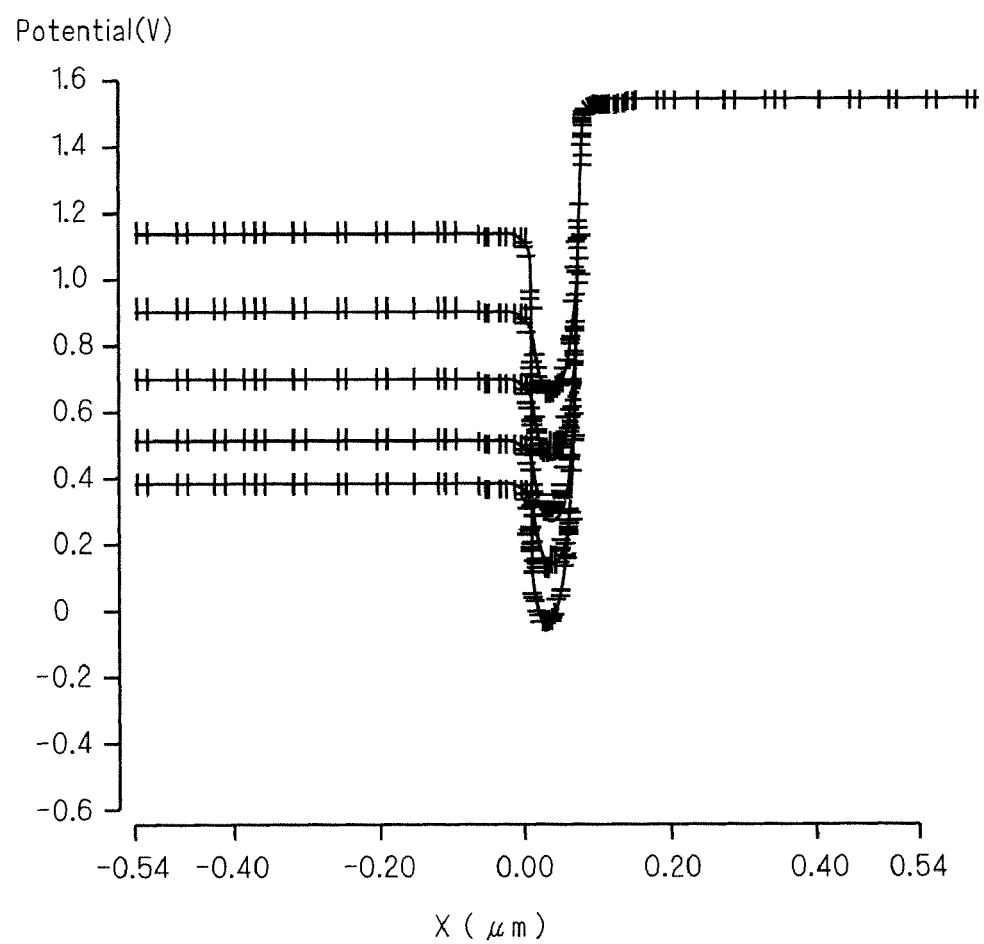
FIG. 7 is a view showing the result of simulating the change of the potential of the storage node when the gate line is raised to high level from low level.

FIGS. 6 and 7 are views showing the result of simulating the change of the potential of the storage node SN when the gate line GL is raised to high level (1.2 V) from low level (0 V) in the write operation. FIG. 6 corresponds to the write operation of the data "0", and FIG. 7 corresponds to the write operation of the data "1". As to X (μm) on the abscissa axis, the region in the vicinity of X=0 corresponds to a body region of the storage transistor STr (charge accumulation node 23b shown in FIG. 3, i.e., the storage node SN), the region of X=negative corresponds to the source region of the storage transistor STr (the impurity diffusion region 22 shown in FIG. 3, i.e., the node PN), and the region of X=positive corresponds to a drain region of the storage transistor STr (the impurity diffusion region 24 shown in FIG. 3). Note that a channel length of the storage transistor STr is 0.1 μm. The potential (V) on the ordinate axis is the potential in the vicinity of a deepest part of each region.

With reference to FIG. 6, in a write operation of the data "0", the potential of the source region of the storage transistor STr is fixed to 0 V, as a result of turning on the access transistor ATr. However, a built-in potential is added, and therefore it is not fixed to 0 V but fixed to 0.53 V in FIG. 6. In this case, it is found that even if the gate line GL is raised to high level (1.2 V) from low level (0 V), the potential of the body region of the storage transistor STr is raised only to about 0.2 V from 0 V.

Meanwhile, with reference to FIG. 7, in the write operation of the data "1", the potential of the source region of the storage transistor STr is in the floating state, as a result of turning off the access transistor ATr. In this case, it is found that the potential of the body region of the storage transistor STr is greatly boosted to about 0.7 V from 0 V, when the gate line GL is raised to high level (1.2 V) from low level (0 V). In addition, it is found that the potential of the source region of the storage transistor STr is also boosted from 0.4 V to 1.2 V, by linking to the boosting of the potential of the body region.

Figure 8:
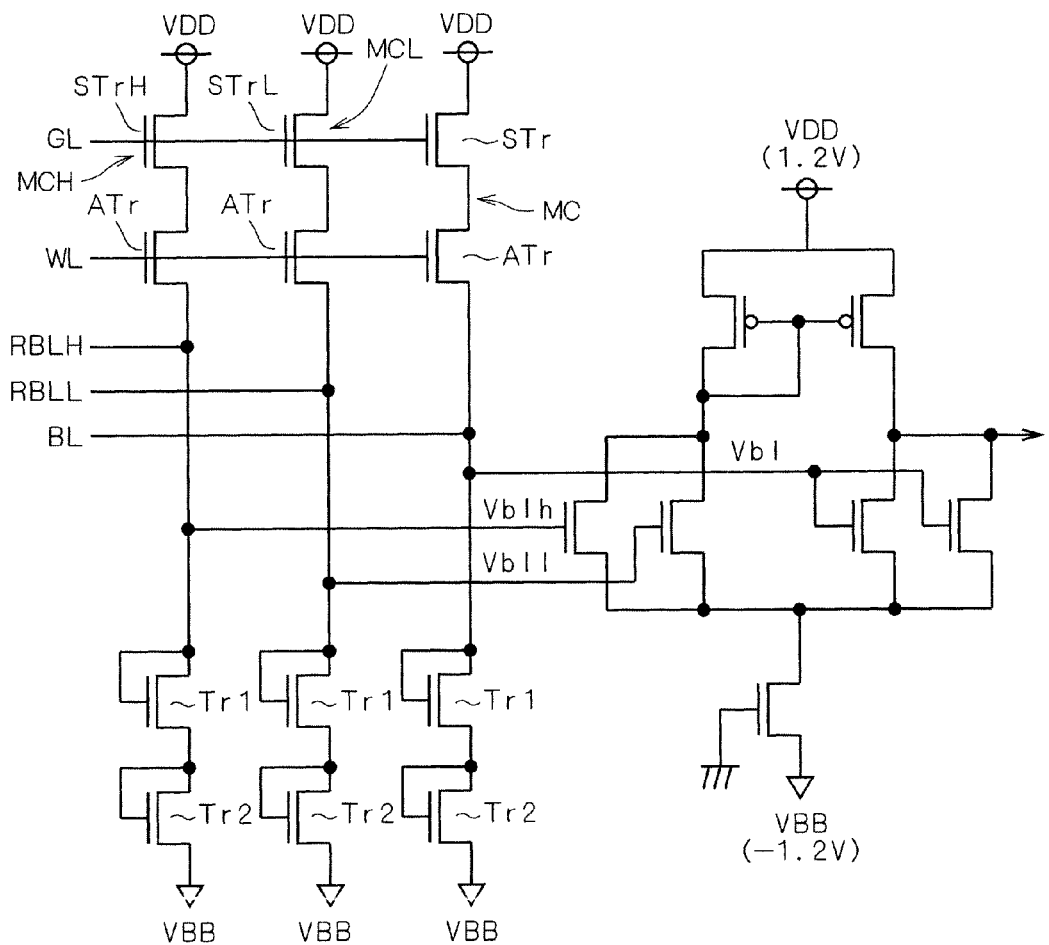
FIG. 8 is a circuit diagram showing the structure of a sense amplifier circuit provided in a sense amplifier shown in FIG. 1.

FIG. 8 is a circuit diagram showing the structure of the sense amplifier circuit provided in the sense amplifier 9 shown in FIG. 1. The memory array 8 shown in FIG. 1 includes memory cells MCH and MCL, in addition to a normal memory cell MC having the storage transistor STr and the access transistor ATr. The memory cell MCH has a storage transistor STrH in which the threshold voltage is set at low level by writing the data "1" without fail in write operation, and the access transistor ATr connected thereto in series. The memory cell MCL has a storage transistor STrL in which the threshold voltage is set at high level by writing the data "0" without fail in the write operation, and the access transistor ATr connected thereto in series. The memory cell MCH is connected to a reference bit line RBLH, and the memory cell MCL is connected to a reference bit line RBLL.

Memory cells MC, MCH, and MCL are connected to a positive power supply potential VDD (such as 1.2 V), respectively. Also, the memory cells MC, MCH, MCL are connected to a negative power supply potential VBB (−VDD, such as −1.2 V), respectively via transistors Tr1 and Tr2. For example, the storage transistor STr, the access transistor ATr, the transistor Tr1, and the transistor Tr2 are connected in series in an order from the power supply potential VDD side, between the power supply potential VDD and the power supply potential VBB. In the transistor Tr1, the drain and the gate are connected to each other, thereby constituting a so-called threshold value connection. The same thing can be said for the transistor Tr2. The transistors Tr1 and Tr2 are arranged with a purpose of setting each read voltage of the bit line BL and the reference bit line RBLH, RBLL at the value in the vicinity of 0 V.

In addition, the memory cell circuit includes a differential amplifier circuit having two pairs of parallel inputs. Potential Vblh of the reference bit line RBLH and potential Vbll of the reference bit line RBLL are inputted in one of the parallel inputs, and potential Vbl of the bit line BL is inputted in another parallel input. The storage transistor STrH has a low threshold voltage and the storage transistor STrL has a high threshold voltage, thus satisfying Vblh>Vbll relatively. In addition, when the memory cell MC stores the data "0", specifically when the threshold voltage of the storage transistor STr is set at high level, the relation of the Vbl and Vbll becomes Vbl=Vbll. Conversely, when the memory cell MC stores the data "1", specifically when the threshold voltage of the storage transistor STr is set at low level, the relation of the Vbl and Vblh becomes Vbl=Vblh. The Vblh, Vbll, and Vbl are compared in the differential amplifier circuit, and when satisfying Vbl=Vbll, a high level signal is outputted from the differential amplifier circuit, and when satisfying Vbl=Vblh, a low level signal is outputted from the differential amplifier circuit. Namely, when the threshold voltage of the storage transistor STr is high level, the high level signal is outputted from the differential amplifier circuit. Meanwhile, when the threshold voltage of the storage transistor STr is low level, the low level signal is outputted from the differential amplifier circuit.

With this structure, the data stored in the memory cell MC can be detected without fail by the sense amplifier circuit.

Figure 9:
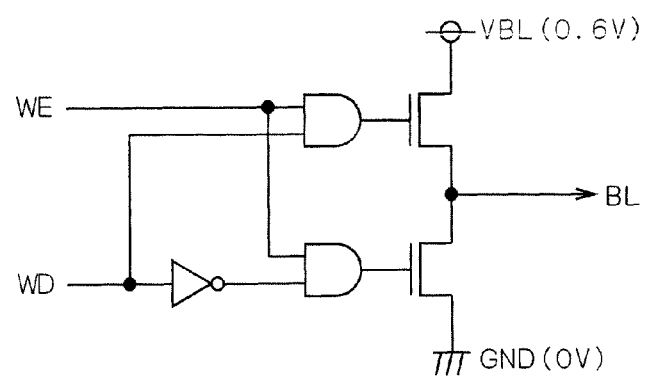
FIG. 9 is a circuit diagram showing the structure of a voltage application circuit to a bit line, in a data write operation.

FIG. 9 is a circuit diagram showing the structure of the voltage application circuit (write circuit) to the bit line BL in the data write operation. As shown in FIG. 5, when the data "0" is written, the bit line BL is required to be set at low level, and when the data "1" is written, the bit line BL is required to be set at high level. With reference to FIG. 9, when a writing permission signal WE is high level, GND (0 V) is applied to the bit line BL when the writing data WD is "0", and VBL (0.6 V) is applied to the bit line BL when the writing data WD is "1". Also, in the data read operation, the writing permission signal WE becomes low level, and as a result, output of the power supply application circuit is set in a high impedance state.

With this structure, the voltage application circuit is capable of surely differentiating the potential of the bit line BL in accordance with the writing data WD, thus preventing erroneous data from being written in the memory cell MC.

Figure 10:
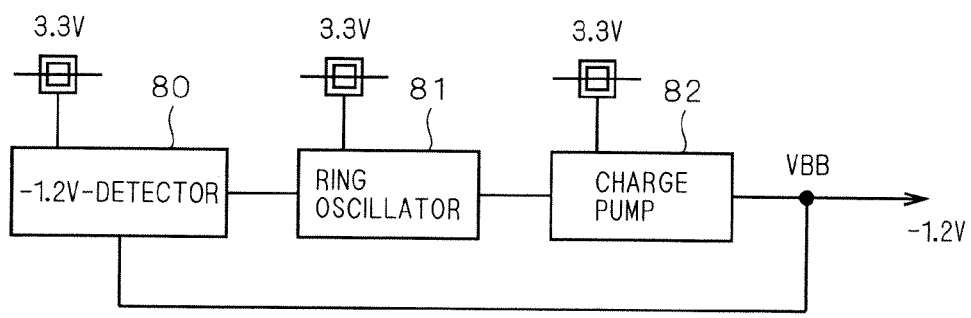
FIG. 10 is a block diagram showing the structure of an internal power supply generating circuit for generating a negative power supply potential shown in FIG. 8.

FIG. 10 is a block diagram showing the structure of the internal power supply generating circuit for generating a negative power supply potential VBB (such as −1.2 V) shown in FIG. 8. The internal power supply generating circuit shown in FIG. 10 is a part of the power supply circuit 10 shown in FIG. 1. A detector 80 compares a reference voltage of −1.2 V and an output voltage (VBB) of a charge pump 82, and based on a detection result of the detector 80, a ring oscillator 81 generates pulse and controls the charge pump 82.

Figure 11:
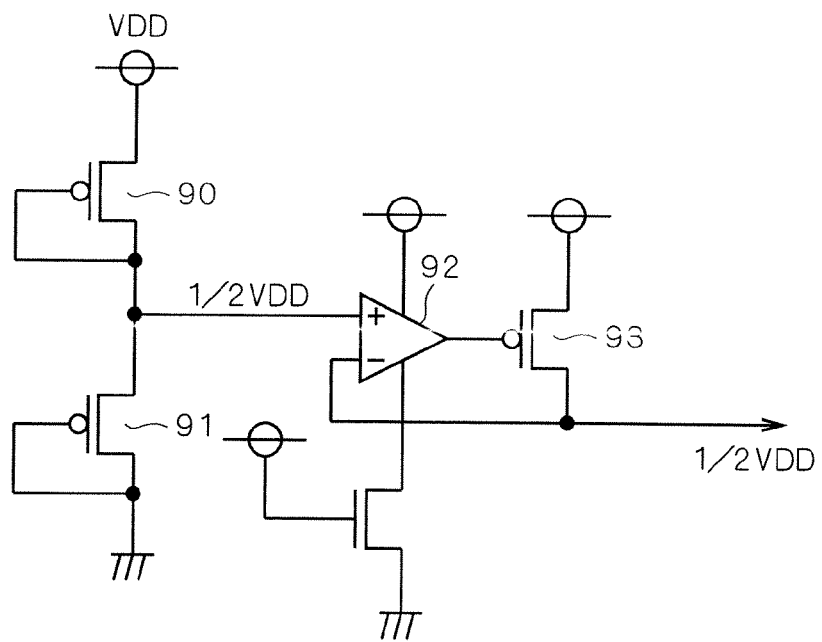
FIG. 11 is a circuit diagram showing the structure of the internal power supply generating circuit for generating each high level of the word line and the bit line shown in FIG. 5.

FIG. 11 is a circuit diagram showing the structure of the internal power supply generating circuit (step-down circuit) for generating each high level (1/2 VDD) of the word line WL and the bit line BL shown in FIG. 5. The internal power supply generating circuit shown in FIG. 11 is a part of the power supply circuit 10 shown in FIG. 1. 1/2 VDD is obtained by dividing voltage of the power supply potential VDD by the transistors 90 and 91, and it is inputted in an error amplifier 92 as a reference voltage. A driver transistor 93 composed of a PMOS transistor is connected to the error amplifier 92, and the 1/2 VDD is outputted from the driver transistor 93, and a negative feedback of the 1/2 VDD is performed to the error amplifier 92.

Thus, according to the semiconductor memory device 1 of Embodiment 1, the memory cell MC can be constituted by the storage transistor STr and the access transistor ATr, thus requiring no memory capacitor which is necessary for the conventional DRAM. In addition, dimensions of the storage transistor STr and the access transistor ATr (layout size and shape) is the same as the dimension of a normal NMOS transistor, thus requiring no special structure. Accordingly, the number of manufacturing steps and necessary numbers of photomasks can be reduced, thus making it possible to reduce a manufacturing cost and a chip area.

Also, the semiconductor memory device 1 can be manufactured by a widely used MOS process, without requiring a special process. Therefore, it is possible to simplify a manufacturing process and reduce the manufacturing cost, compared to the semiconductor memory device disclosed in Patent Document 1.

Further, it is possible to greatly differentiate the threshold voltage of the storage transistor STr, between the state in which the data "1" is stored and the state in which the data "0" is stored. Therefore, a stable operation can be realized, compared to the semiconductor memory device disclosed in Patent Document 1.

In addition, the storage transistor STr and the access transistor ATr are constituted by the SOI transistor, and a parasitic capacitance is small. Therefore, it is possible to realize speed-up of operation and reduction of power consumption, compared to the case of using a bulk substrate. Further, the storage node SN is electrically separated from the access transistor ATr, etc. Therefore, tolerance against noises is high. In addition, major part of the circumference of the storage node SN is surrounded by the element isolation film 15. Therefore, a significant effect by gate coupling can be obtained, and also it is possible to obtain the effect that the difference of the threshold voltage of the storage transistor STr is made large between the state of the data "1" and the state of the data "0".

Embodiment 2

Figure 12:
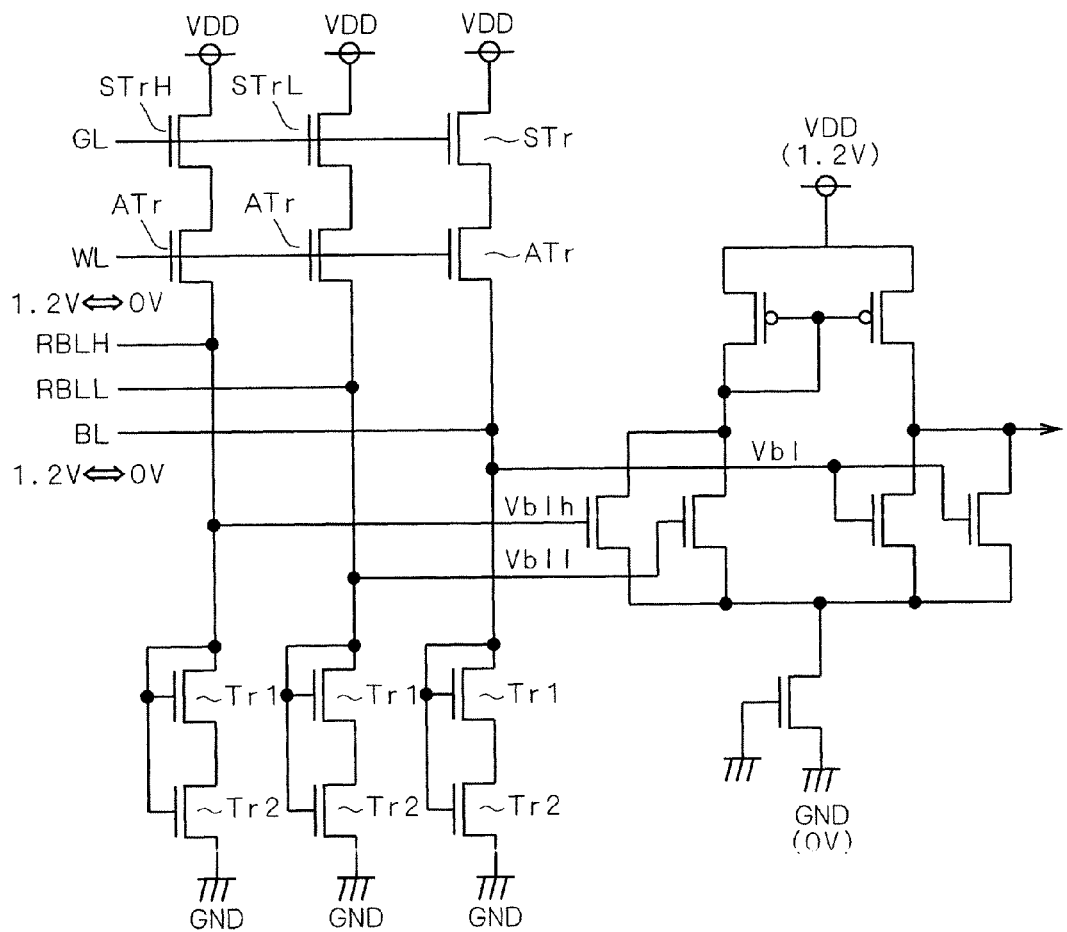
FIG. 12 is a circuit diagram showing the structure of the sense amplifier circuit provided in the sense amplifier, correspondingly to FIG. 8.

FIG. 12 is a circuit diagram showing the structure of the sense amplifier circuit provided in the sense amplifier 9, correspondingly to FIG. 8. An entire structure of the semiconductor memory device 1 of Embodiment 2 and the structure of the memory cell MC are the same as that of Embodiment 1. With reference to FIG. 12, the storage transistor STr, the access transistor ATr, the transistor Tr1, and the transistor Tr2 are connected in series in this order from the power supply potential VDD side, between the power supply potential VDD and a ground potential GND. The same thing can be said for the storage transistor STrH and STrL. Each gate of the transistors Tr1 and Tr2 is commonly connected to the drain of the transistor Tr1, thus constituting a so-called threshold value connection.

Figure 13:
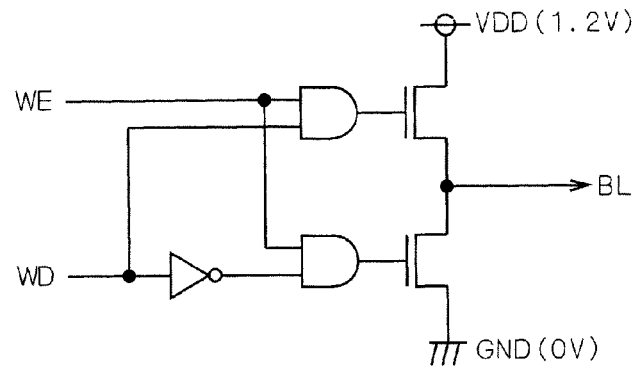
FIG. 13 is a circuit diagram showing the structure of the voltage application circuit to the bit line, correspondingly to FIG. 9.

FIG. 13 is a circuit diagram showing the structure of the voltage application circuit to the bit line BL, correspondingly to FIG. 9. Instead of the VBL (0.6 V) of FIG. 9, the VDD (1.2 V) is adopted, and this is a different point from Embodiment 1.

Figure 14:
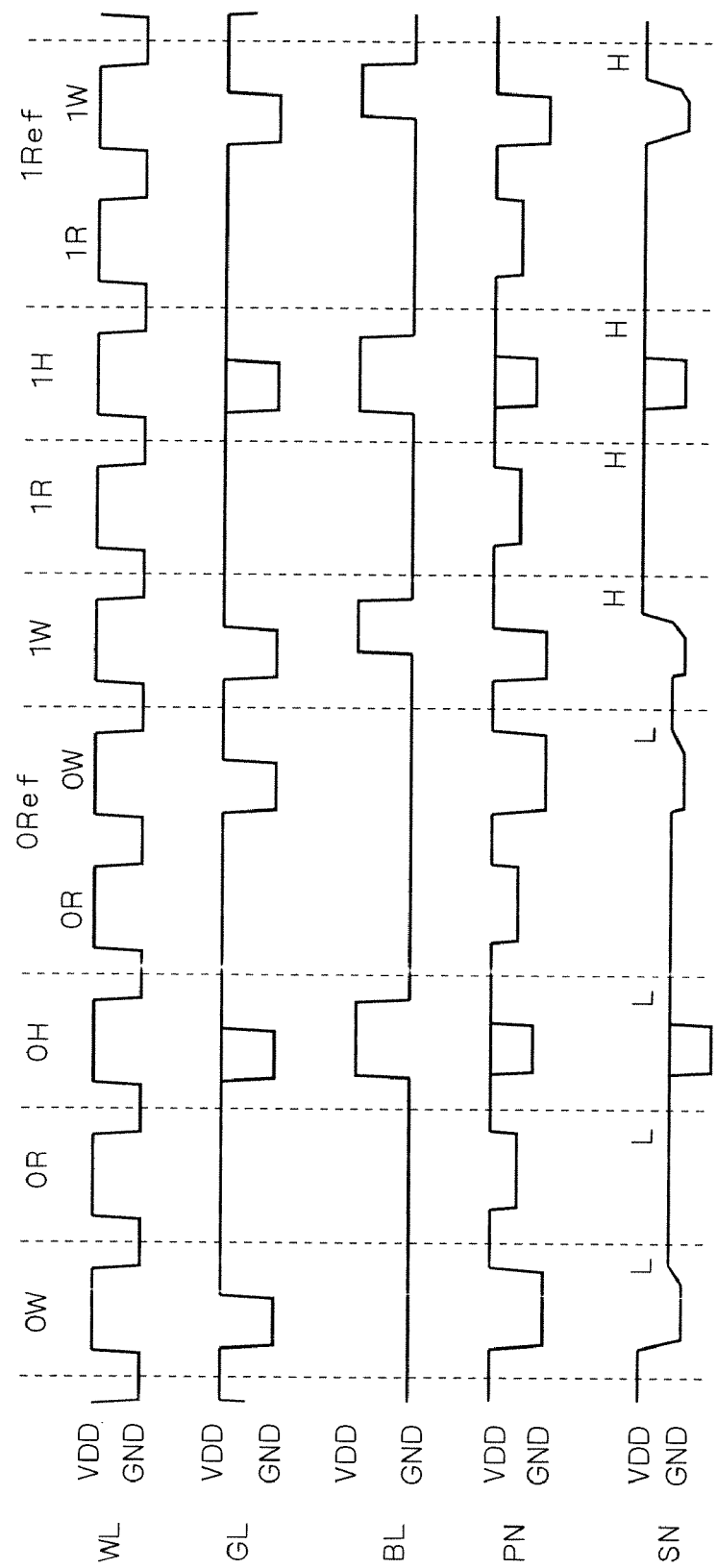
FIG. 14 is a timing chart for explaining the operation of the semiconductor memory device, correspondingly to FIG. 5.

FIG. 14 is a timing chart for explaining the operation of the semiconductor memory device 1, correspondingly to FIG. 5. In FIG. 5, each high level of the word line WL and the bit line BL is 1/2 VDD instead of VDD in FIG. 14, and this is a different point from Embodiment 1.

Thus, according to the semiconductor memory device 1 of Embodiment 2, use of the negative power supply potential VBB (−1.2 V) can be avoided, thus requiring no internal voltage generating circuit shown in FIG. 10. Further, along with this, each high level of the word line WL and the bit line BL becomes not 1/2 VDD but VDD, thus requiring no internal voltage generating circuit shown in FIG. 11. Accordingly, the manufacturing cost and the chip area can be reduced, compared to Embodiment 1.

Moreover, in the structure shown in FIG. 8, wiring connection between gate and drain is required, for each transistor Tr1 and Tr2. However, it is not required in the structure shown in FIG. 12. Therefore, the transistors Tr1 and Tr2 can be constituted by the transistor having the same shape as the memory cell transistor (storage transistor STr and the access transistor ATr). Accordingly, variation of characteristics of the memory cell transistor and the transistors Tr1 and Tr2 caused by variation of the process can be prevented, thus making it possible to realize a further stable read operation.

Embodiment 3

Figure 15:
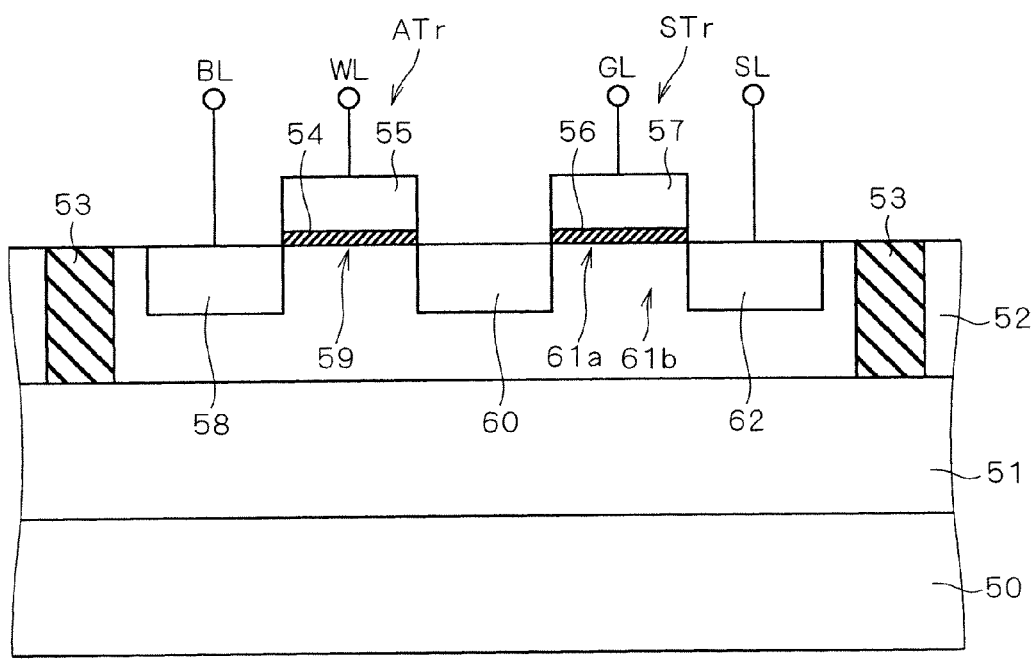
FIG. 15 is a sectional view showing the structure of the memory cell, correspondingly to FIG. 3.

FIG. 15 is a sectional view showing the structure of the memory cell MC, correspondingly to FIG. 3. The entire structure of the semiconductor memory device 1 of Embodiment 3 is the same as Embodiments 1 and 2. In Embodiment 1, the storage transistor STr and the access transistor ATr are formed by using the SOI substrate 14. However, in Embodiment 3, they are constituted by using the bulk substrate, and this is the different point from Embodiment 1.

With reference to FIG. 15, an N well 51 is formed on a P-type silicon substrate 50, and a P well 52 is formed on the N well 51. The P well 52 is electrically separated from the P-type silicon substrate 50 by the N well 51. Adjacent memory cells MC are electrically separated from each other by STI (Shallow Trench Isolation) 53 that reaches the upper surface of the N well 51 from the upper surface of the P well 52. Therefore, separation width of the STI 53 is not required to be increased, and the increase of the chip area is avoided.

The storage transistor STr has N-type impurity diffusion regions 60 and 62, a channel formation region 61a, a charge accumulation node 61b, a gate oxide film 56, and a gate electrode 57. The impurity diffusion regions 60 and 62 are opposed to each other through the channel formation region 61a defined in the upper surface of the P well 52. The gate oxide film 56 is formed on the channel formation region 61a, and the gate electrode 57 is formed on the gate oxide film 56. The charge accumulation node 61b is formed below the channel formation region 61a. The charge accumulation node 61b is electrically separated from another adjacent memory cell MC by the STI 53. The gate electrode 57 is connected to the gate line GL, and the impurity diffusion region 62 is connected to the source line SL.

The access transistor ATr has N-type impurity diffusion regions 58 and 60, a channel formation region 59, a gate oxide film 54, and a gate electrode 55. The impurity diffusion region 58 is opposed to the impurity diffusion region 60, through the channel formation region 59 defined in the upper surface of the P well 52. The gate oxide film 54 is formed on the channel formation region 59, and the gate electrode 55 is formed on the gate oxide film 54. The gate electrode 55 is connected to the word line WL, and the impurity diffusion region 58 is connected to the bit line BL.

Note that by making a conductive type of each part opposite, the storage transistor STr and the access transistor ATr can be constituted by a PMOS transistor by using an N-type silicon substrate.

Thus, according to the semiconductor memory device 1 of Embodiment 3, the storage transistor STr and the access transistor ATr are formed by using not the SOI substrate but the bulk substrate. Accordingly, generally, the cost can be reduced, when compared to the case of using the SOI substrate which is more expensive than the bulk substrate.

Embodiment 4

Figure 16:
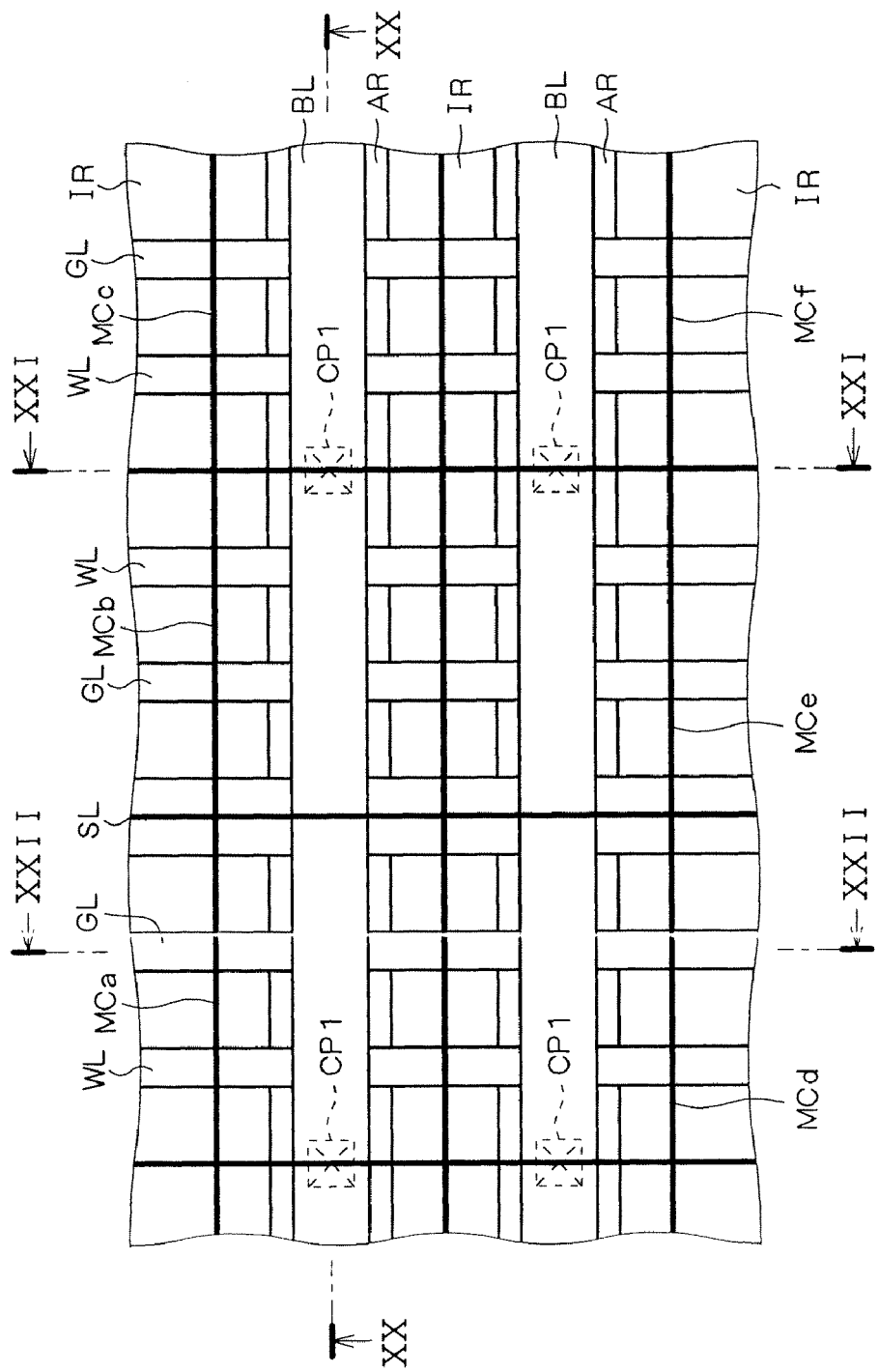
FIG. 16 is a top view showing an upper surface layout of the semiconductor memory device according to Embodiment 4 of the present invention.
Figure 17:
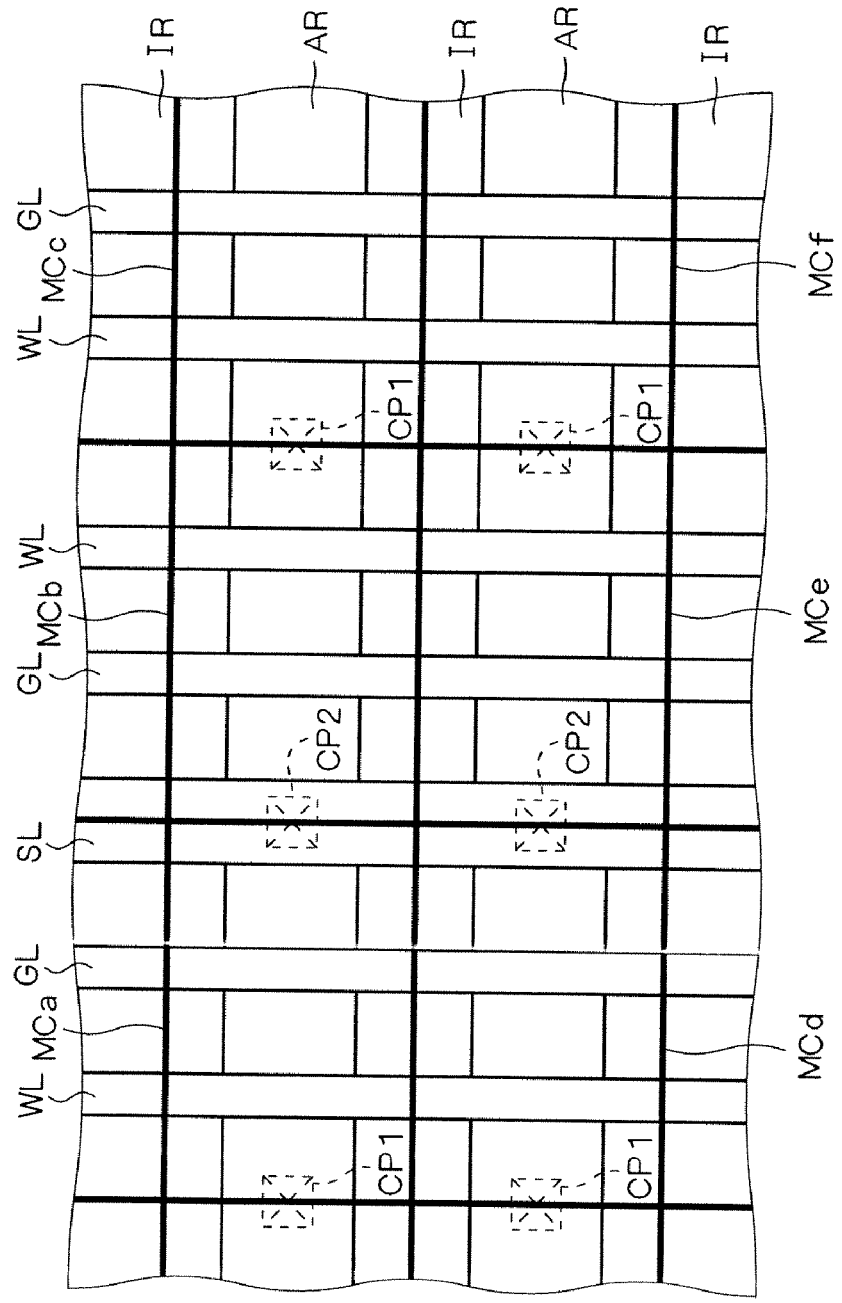
FIG. 17 is a top view showing the upper surface layout of the semiconductor memory device according to Embodiment 4 of the present invention.
Figure 20:
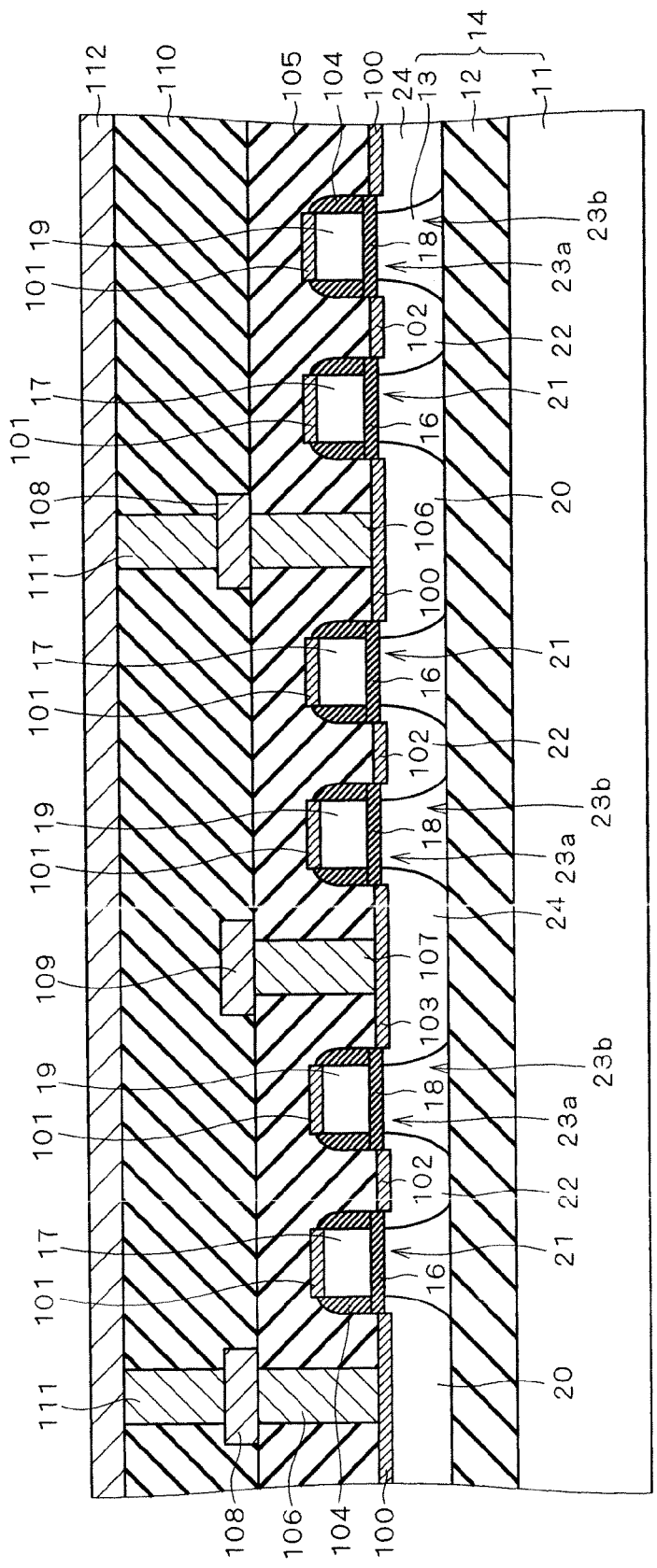
FIG. 20 is a sectional view showing the sectional structure relating to a position along line XX-XX shown in FIG. 16.
Figure 21:
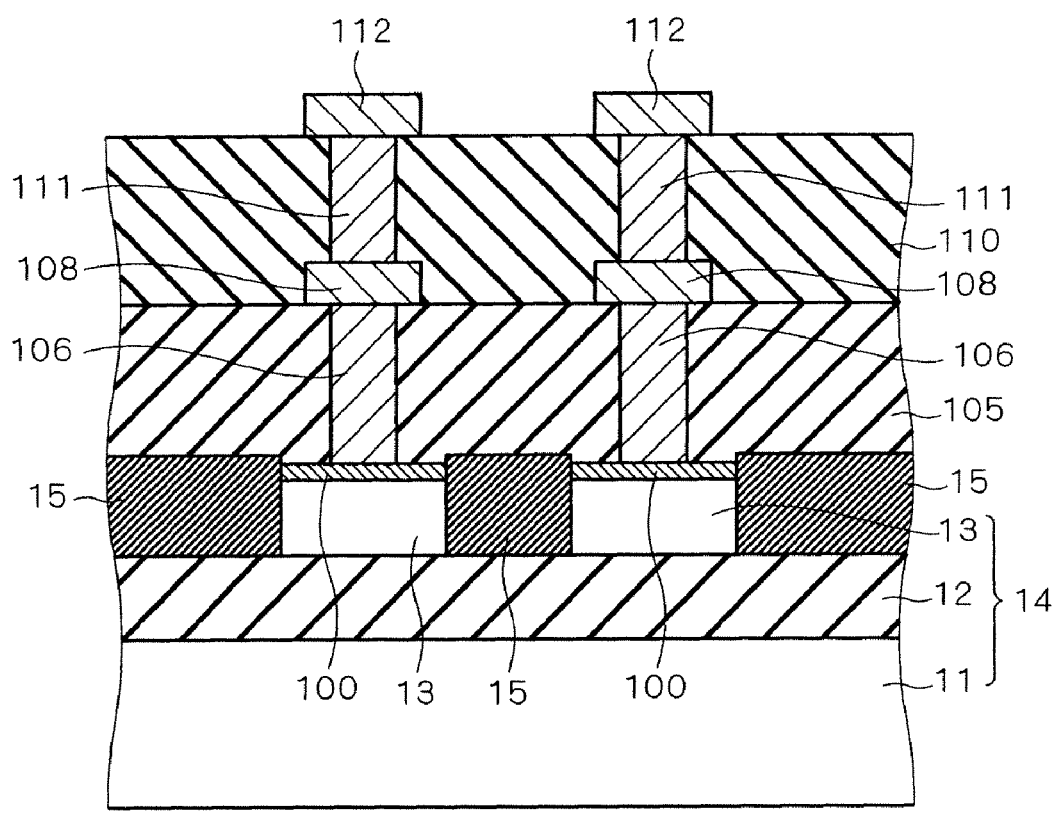
FIG. 21 is a sectional view showing the sectional structure relating to the position along line XXI-XXI shown in FIG. 16.
Figure 22:
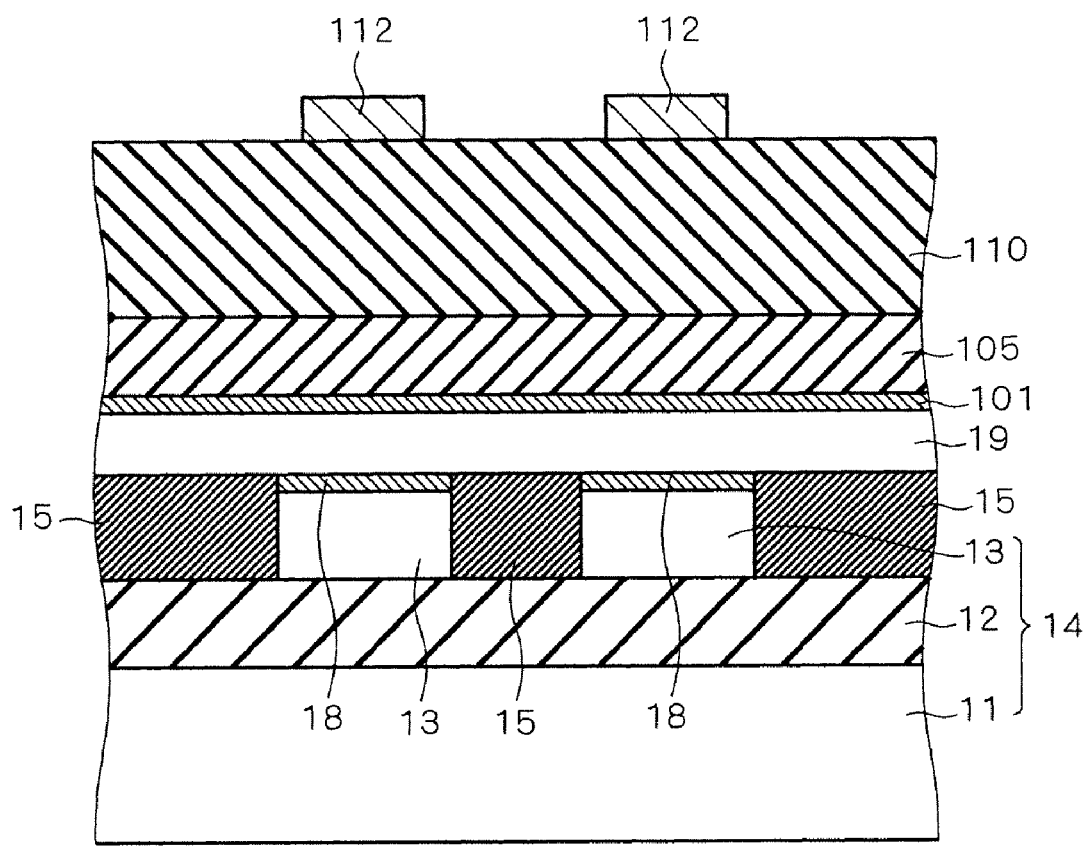
FIG. 22 is a sectional view showing the sectional structure relating to the position along line XXII-XXII shown in FIG. 16.

FIGS. 16 to 18 are top views showing an upper surface layout of the semiconductor memory device of Embodiment 4 of the present invention. As is clear from the layout of each layer, the view wherein the bit line BL is omitted from FIG. 16 corresponds to FIG. 17, and the view wherein the word line WL, the gate line GL, and the source line SL are omitted from FIG. 17 corresponds to FIG. 18. FIG. 19 is an equivalent circuit view corresponding to the layout shown in FIG. 16. Further, FIGS. 20, 21 and 22 are sectional views showing a sectional structure of positions along lines XX-XX, XXI-XXI, and XXII-XXII shown in FIG. 16.

With reference to FIG. 18, an element isolation region IR and an element formation region AR are respectively formed in a profile of extending along a first direction. The isolation film 15 shown in FIGS. 21 and 22 is formed in the element formation region IR. That is, by forming the element isolation film 15 in the profile of extending along the first direction, the element formation region AR extending in the first direction is defined by the element isolation film 15. The element formation region AR continuously extends along the first direction, without being divided by the element isolation film 15.

With reference to FIG. 17, the word line WL, the gate line GL, and the source line SL are respectively formed in the profile of extending along a second direction. The second direction is a direction orthogonal to the first direction. The gate line GL is formed on both sides of the source line SL, and the word line WL is formed outside the gate line GL (opposite side of the source line SL). Adjacent word line WL is formed outside the word line WL (opposite side of the gate line GL). The source line SL is formed as a first layer wiring in a multilayer wiring structure, and is connected to the element formation region AR via a contact plug CP2.

With reference to FIG. 16, the bit line BL is formed in the profile of extending in the first direction above the element formation region AR. The bit line BL is formed as a second layer wiring in the multilayer wiring structure, and is connected to the element formation region AR via a contact plug CP1. Note that it is also possible to form the bit line BL as the first layer wiring and form the source line SL as the second layer wiring.

A plurality of memory cells MC (MCa to MCf) are arranged along the bit line BL. The bit line BL is shared by the plurality of memory cells MC arranged alongside in the first direction. In addition, one source line SL is shared by two memory cells MC adjacent to each other along the first direction. In the example shown in FIG. 16, the source line SL is shared by the memory cell MCa of left end and central memory cell MCb. Also, the word line WL, the gate line GL, and the source line SL are shared by the plurality of memory cells MC arranged in the second direction.

With reference to FIG. 19, the memory cell MC has the storage transistor STr and the access transistor ATr in the same way as Embodiments 1 to 3. The structure and the operation of the storage transistor STr and the access transistor ATr are the same as those of Embodiments 1 to 3.

With reference to FIG. 20, the SOI substrate 14 has the structure in which the silicon substrate 11, the buried oxide film layer 12, and the silicon layer 13 are laminated in this order. The storage transistor STr has the N-type impurity diffusion regions 22 and 24, the channel formation region 23a, the charge accumulation node 23b, the gate oxide film 18, and the gate electrode 19 corresponding to the gate line GL shown in FIGS. 16 and 17. The impurity diffusion regions 22 and 24 are formed so as to reach the upper surface of the buried oxide film layer 12 from the upper surface of the silicon layer 13, and are opposed to each other through the channel formation region 23a defined in the upper surface of the silicon layer 13. The gate oxide film 18 is formed on the channel formation region 23a, and the gate electrode 19 is formed on the gate oxide film 18. The charge accumulation node 23b is formed below the channel formation region 23a.

The access transistor ATr has N-type impurity diffusion regions 20 and 22, a channel formation region 21, a gate oxide film 16, and the gate electrode 17 corresponding to the word line WL shown in FIGS. 16 and 17. The impurity diffusion region 20 is formed so as to reach the upper surface of the buried oxide film layer 12 from the upper surface of the silicon layer 13, and is opposed to the impurity diffusion region 22 through the channel formation region 21 defined in the upper surface of the silicon layer 13. The gate oxide film 16 is formed on the channel formation region 21, and the gate electrode 17 is formed on the gate oxide film 16.

A sidewall spacer 104 composed of an insulating film is formed on the side surfaces of the gate electrodes 17 and 19. A silicide layer 100 is formed on the upper surface of the impurity diffusion region 20, a silicide layer 102 is formed on the upper surface of the impurity diffusion region 22, a silicide layer 103 is formed on the upper surface of the impurity diffusion region 24, and a silicide layer 101 is formed on the upper surface of the gate electrodes 17 and 19.

A contact plug 106 connected to the silicide layer 100, and a contact plug 107 connected to the silicide layer 103 are formed in an interlayer insulating film 105. A metal film 108 connected to the contact plug 106 and a metal wiring 109 connected to the contact plug 107 are formed on the interlayer insulating film 105. The contact plug 107 corresponds to the contact plug CP2 shown in FIG. 17. The metal wiring 109 corresponds to the source line SL shown in FIGS. 16 and 17.

A contact plug 111 connected to the metal film 108 is formed in an interlayer insulating film 110. Metal wiring 112 connected to the contact plug 111 is formed on the interlayer insulating film 110. The contact plugs 106 and 111 and the metal film 108 correspond to the contact plug CP1 shown in FIG. 16. The metal wiring 112 corresponds to the bit line BL shown in FIG. 16.

According to FIGS. 21 and 22, a so-called full-trench type element isolation film 15 is formed so as to reach the upper surface of the buried oxide film layer 12 from the upper surface of the silicon layer 13. Namely, the element isolation film 15 has a bottom face that is brought into contact with the upper surface of the buried oxide film layer 12.

Figure 23:
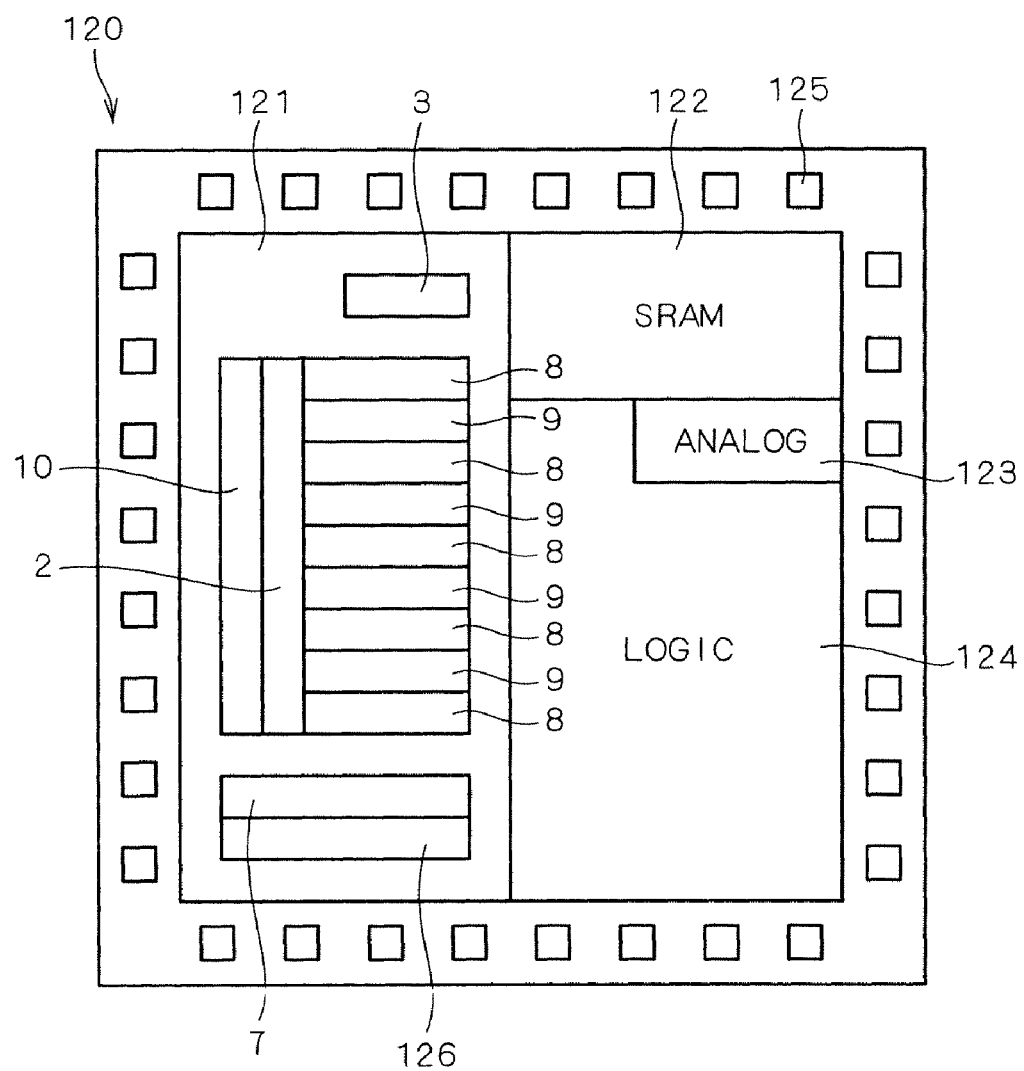
FIG. 23 is a top view schematically showing the structure of an IC chip wherein a semiconductor memory and a logic circuit are constituted as one chip.

FIG. 23 is a top view schematically showing the structure of an IC chip 120 constituted by the semiconductor memory and the logic circuit as one chip. The IC chip 120 has a memory cell array region 121 in which the semiconductor memory device of the present invention is formed, a SRAM region 122 in which a SRAM is formed, an analog circuit region 123 in which an analog circuit is formed, and a logic circuit region 124 in which a logic circuit is formed. A plurality of I/O pads 125 are formed alongside on the peripheral edge of the IC chip 120.

The memory cell array region 121 corresponds to the semiconductor memory device 1 shown in FIG. 1. The address decoder 2, input/output circuit 3, buffer circuit 126, control circuit 7, memory array 8, sense amplifier 9, and power supply circuit 10 are formed in the memory cell array region 121. The buffer circuit 126 corresponds to the address buffer 4, clock buffer 5, and control signal buffer 6 shown in FIG. 1.

Figure 24:
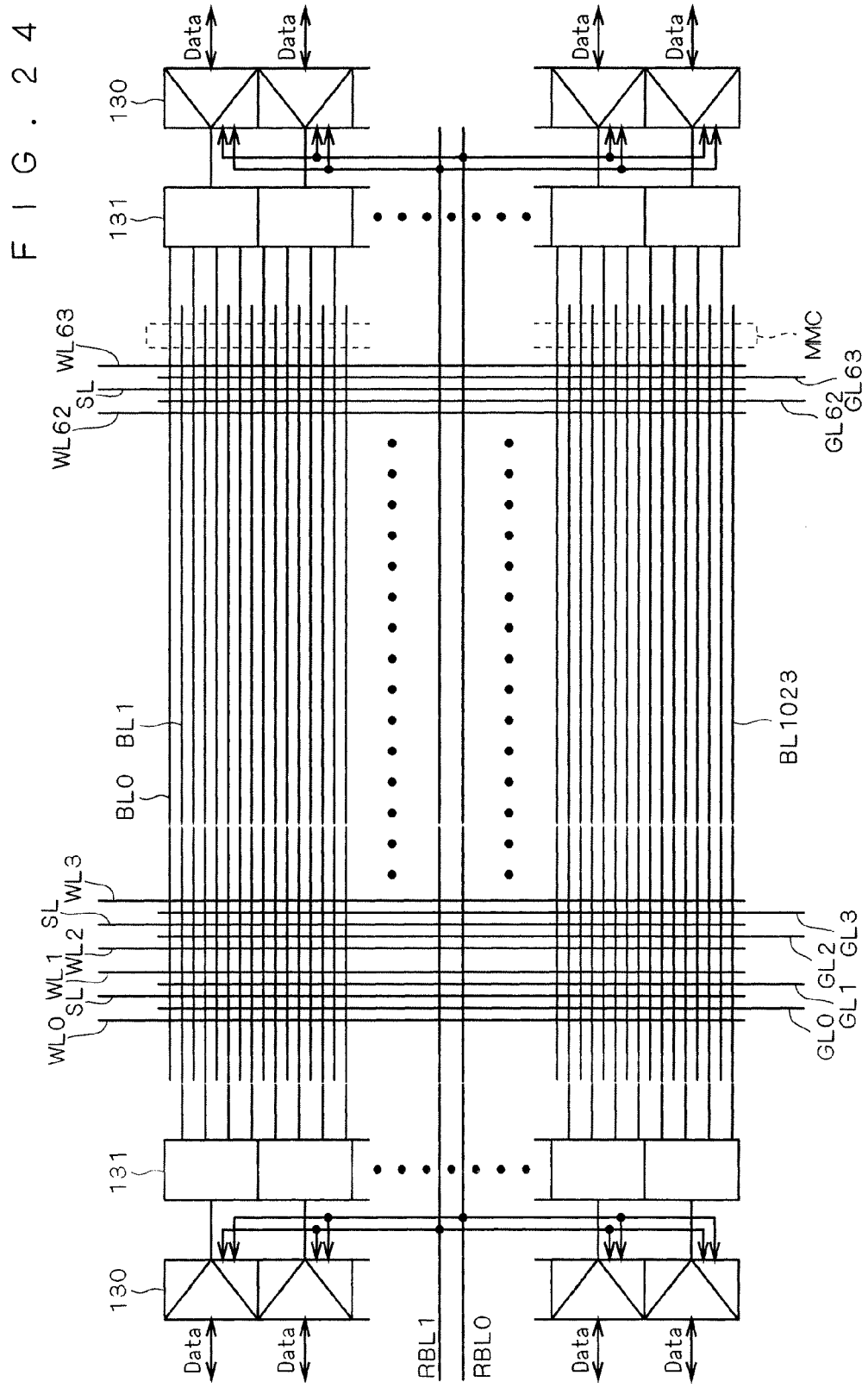
FIG. 24 is a view schematically showing the structure of a fundamental array of a memory cell array region shown in FIG. 23.

FIG. 24 is a view schematically showing the structure of a basic array of 64 kb, relating to the memory cell array region 121 shown in FIG. 23. 64 word lines WL0 to WL63 in total extending along a row direction (vertical direction in FIG. 24) are arranged side by side in a column direction (horizontal direction in FIG. 24). In addition, 1024 bit lines BL0 to BL1023 extending along the column direction are arranged side by side in the row direction. A plurality of source lines SL shown in FIG. 24 are connected to each other at end portion, and the power supply potential VDD is applied to the source line SL. Four bit lines BL are connected to one column selector 131, and the column selector 131 is connected to a circuit 130 including the sense amplifier and the write driver. Also, reference bit lines RBL1, RBL0 corresponding to the reference bit lines RBLH, RBLL shown in FIG. 8 and a mirror memory cell region MMC formed with the transistors Tr1 and Tr2 shown in FIG. 8 are formed.

FIGS. 25 to 30 are sectional views showing the manufacturing method of the IC chip 120 shown in FIG. 23 in the order of steps. FIGS. 25 to 30 show side by side the structure of the memory cell array region corresponding to FIG. 22 and the structure of a peripheral circuit region. Here, the "memory cell array region" corresponds to the memory array 8 shown in FIG. 23. Also, the "peripheral circuit region" not only corresponds to the SRAM region 122, analog circuit region 123, and logic circuit region 124 shown in FIG. 23, but also corresponds to the address decoder 2, input/output circuit 3, buffer circuit 126, control circuit 7, sense amplifier 9, and power supply circuit 10 in the memory cell array region 121 shown in FIG. 23.

Figure 25:
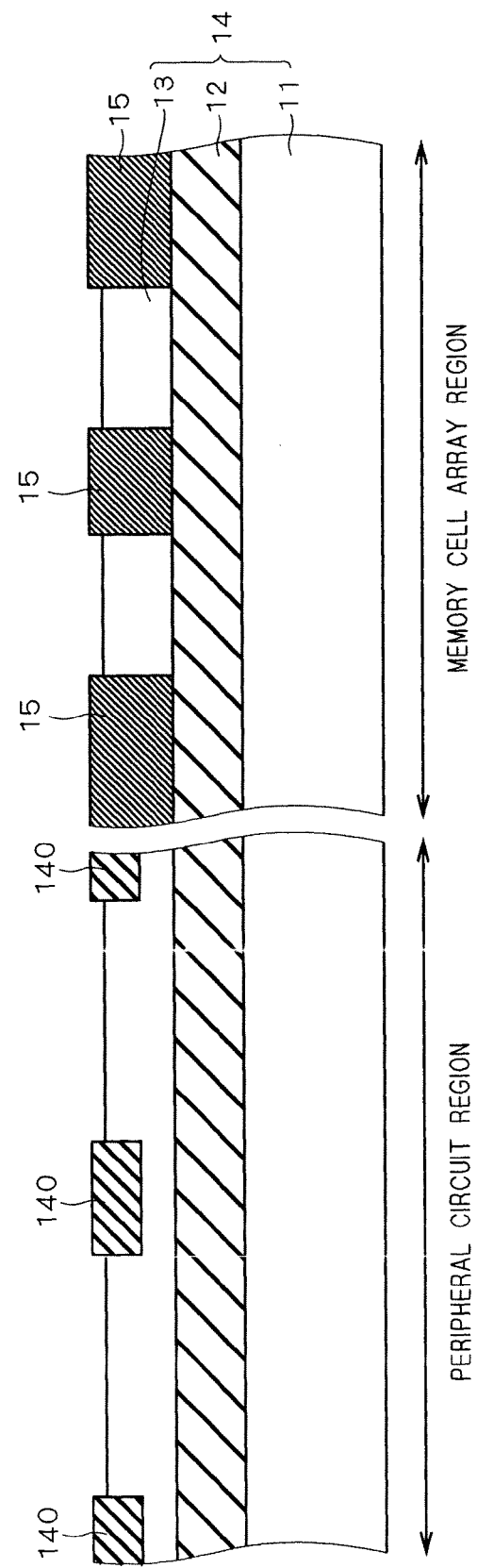
FIG. 25 is a sectional view showing a manufacturing method of the IC chip shown in FIG. 23 in an order of steps.

With reference to FIG. 25, first, a so-called partial trench type element isolation film 140 is formed in the upper surface of the silicon layer 13 in the peripheral circuit region of the SOI substrate 14, by a publicly-known trench isolation technique. Also, a so-called full trench type element isolation film 15 is formed in the upper surface of the silicon layer 13 in the memory cell array region of the SOI substrate 14. The element isolation film 140 is formed on the upper surface of the silicon layer 13 without reaching the upper surface of the buried oxide film layer 12. Specifically, the element isolation film 140 has the bottom face which is not brought into contact with the upper surface of the buried oxide film layer 12.

Figure 26:
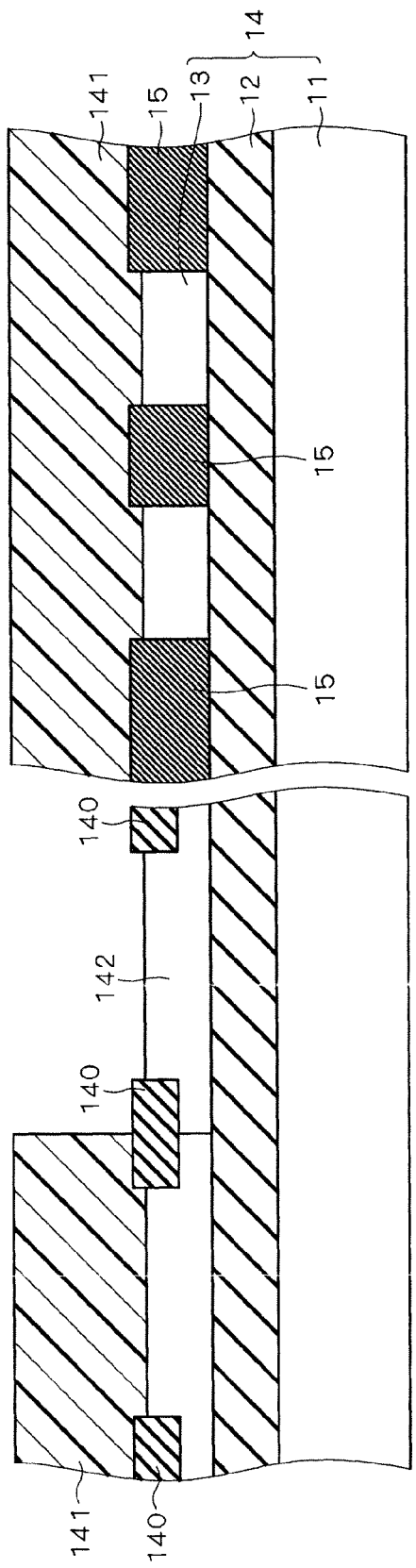
FIG. 26 is a sectional view showing the manufacturing method of the IC chip shown in FIG. 23 in the order of steps.

With reference to FIG. 26, photoresist 141 having a predetermined opening pattern is formed on the silicon layer 13 by a photolithography method, and thereafter ion implanting of the N-type impurity such as phosphorus and arsenic is performed. Whereby, an N well 142 is formed in the silicon layer 13 of a part not covered with the photoresist 141. Thereafter, the photoresist 141 is removed.

Figure 27:
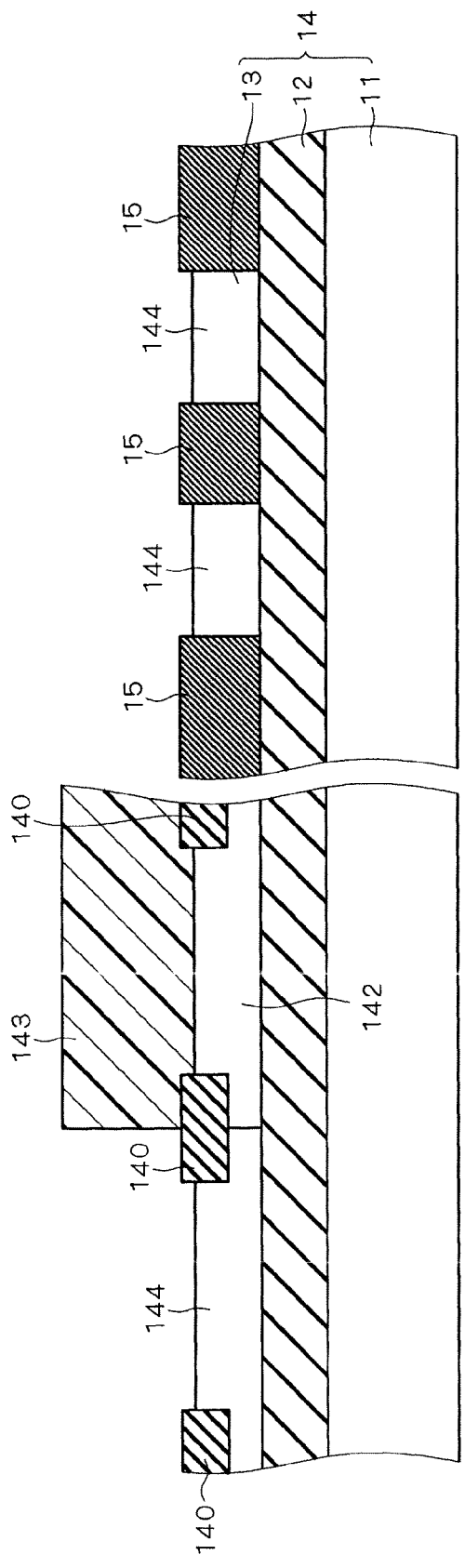
FIG. 27 is a sectional view showing the manufacturing method of the IC chip shown in FIG. 23 in the order of steps.

With reference to FIG. 27, the photoresist 143 having the predetermined opening pattern is next formed on the silicon layer 13 by the photolithography method, and thereafter the ion implanting of the P-type impurity such as boron is performed. Whereby the P well 144 is formed in the silicon layer 13 of the part not covered with the photoresist 143. Thereafter, the photoresist 143 is removed.

Figure 28:
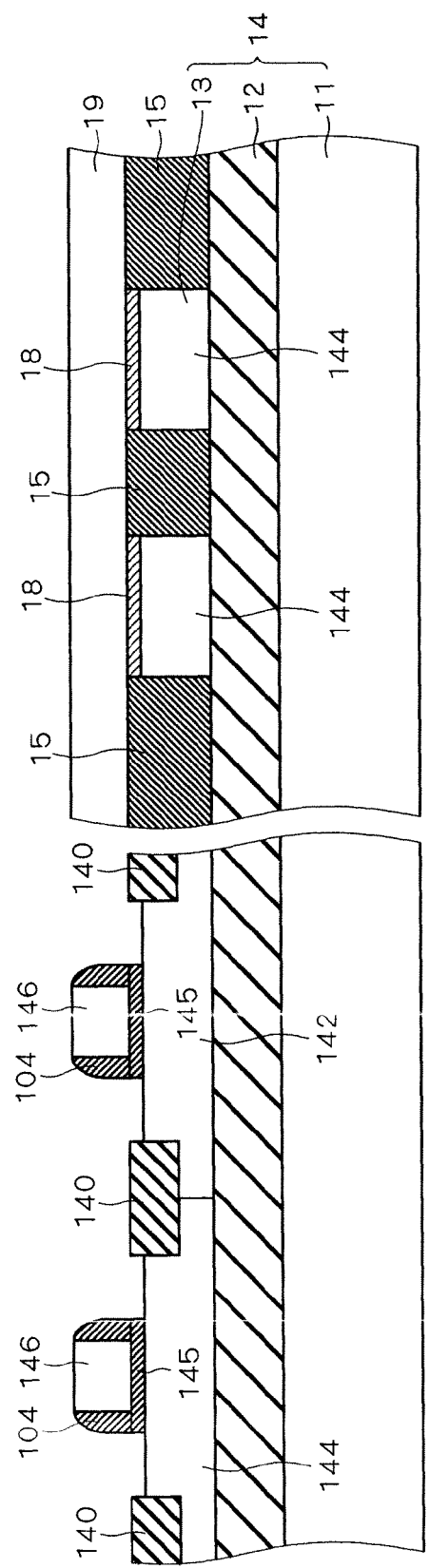
FIG. 28 is a sectional view showing the manufacturing method of the IC chip shown in FIG. 23 in the order of steps.

With reference to FIG. 28, gate oxide films 145 and 18 are next formed by thermal oxidation. Next, after a polysilicon film is deposited on the entire surface, by patterning the polysilicon film, gate electrodes 146 and 19 are formed. Next, after depositing a silicon nitride film on the entire surface, by etching back the silicon nitride film, the sidewall spacer 104 is formed. Although not shown in FIG. 28, the sidewall spacer 104 is also formed on the side surface of the gate electrode 19 (see FIG. 20).

Figure 29:
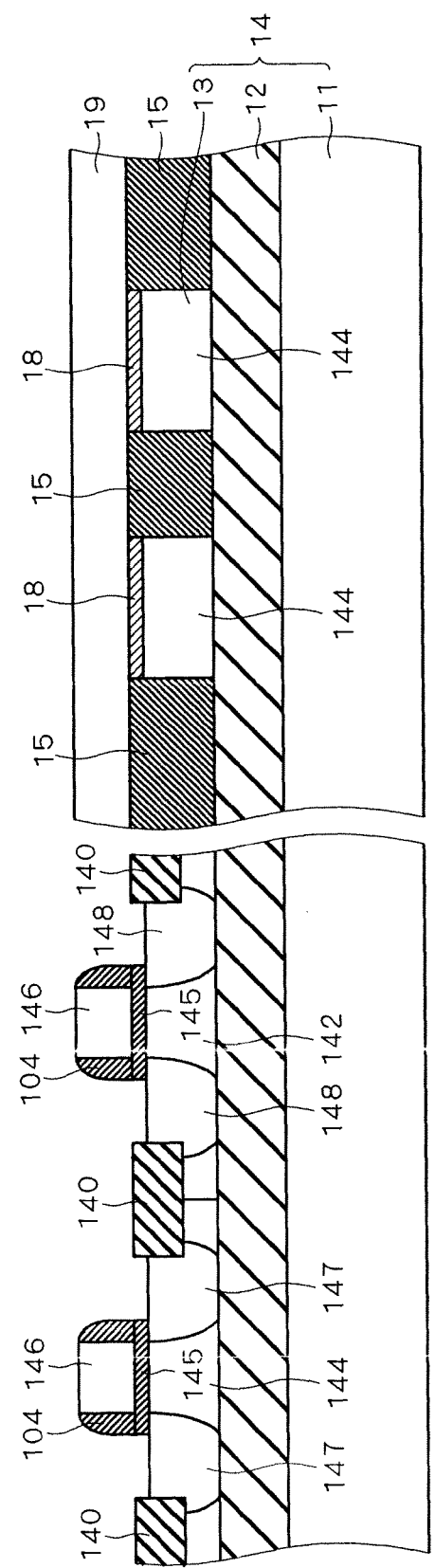
FIG. 29 is a sectional view showing the manufacturing method of the IC chip shown in FIG. 23 in the order of steps.

With reference to FIG. 29, a P-type impurity diffusion region 148 is formed in the N well 142 by the photolithography method and the ion implanting method. Next, an N-type impurity diffusion region 147 is formed in the P well 144 by the photolithography method and the ion implanting method. Although not shown in FIG. 29, when the impurity diffusion region 147 is formed, the impurity diffusion regions 20, 22, 24 are also formed in the memory cell array region (see FIG. 20).

Figure 30:
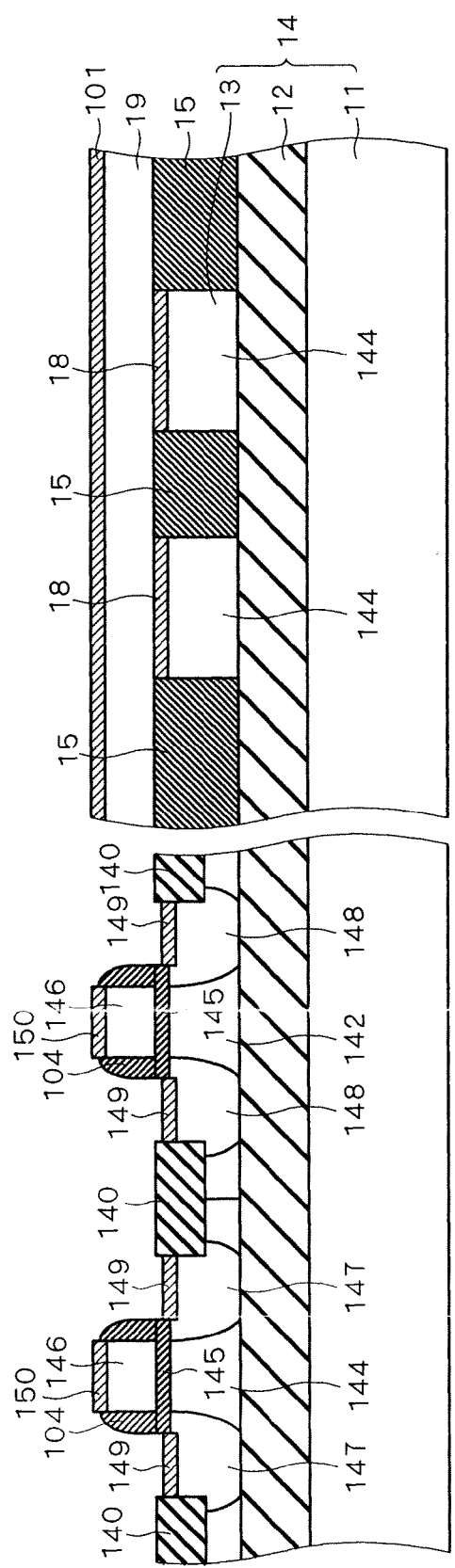
FIG. 30 is a sectional view showing the manufacturing method of the IC chip shown in FIG. 23 in the order of steps.

With reference to FIG. 30, after a silicide protection film composed of silicon oxide film is formed in a desired region as needed, by forming exposed silicon into silicide by using titanium and cobalt, silicide layers 149, 150, and 101 are formed. Although not shown in FIG. 30, when the silicide layers 149, 150, and 101 are formed, silicide layers 100, 102, and 103 are also formed in the memory cell array region (see FIG. 20).

As is clear from FIGS. 25 to 30, the IC chip 120 of Embodiment 4 can be manufactured by a widely used MOS process, without requiring a special process. The semiconductor memory device of Embodiment 1 can also be manufactured by the same process as FIGS. 25 to 30. Therefore, the semiconductor memory device 1 of Embodiment 1 can also be manufactured by the widely-used MOS process.

Figure 31:
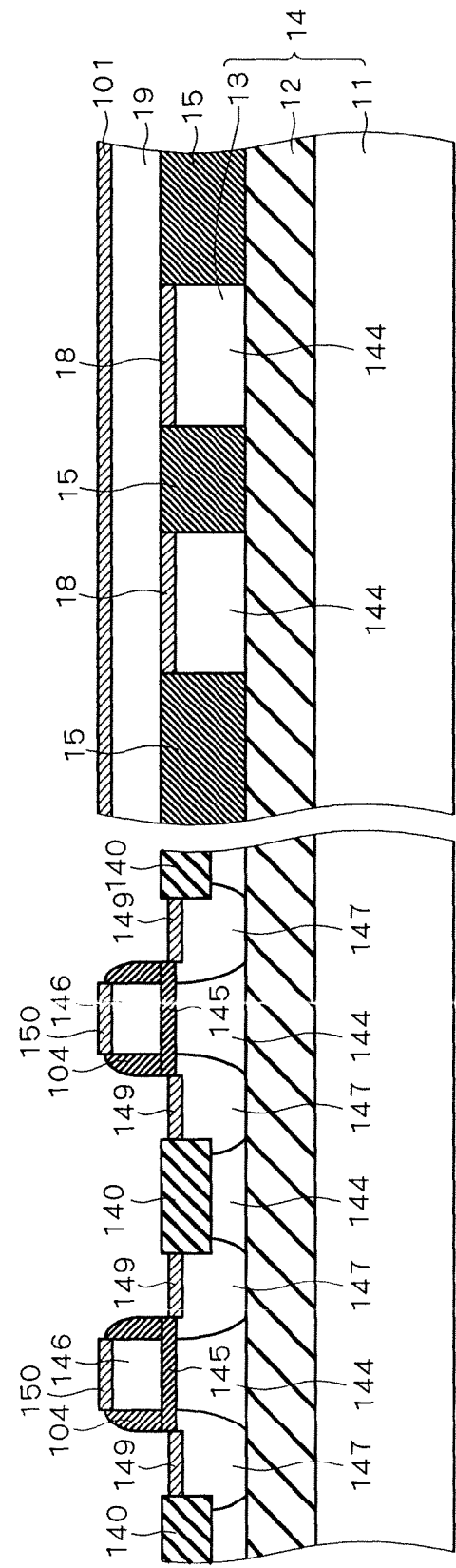
FIG. 31 is a sectional view showing a modification of the structure shown in FIG. 30.

FIG. 31 is a sectional view showing a modification of the structure shown in FIG. 30. The N well 142 is not formed in the peripheral circuit region, and only the P well 144 is formed. Also, instead of the PMOS having the P-type impurity diffusion region 148 shown in FIG. 30, NMOS having the N-type impurity diffusion region 147 is formed.

As is shown in FIGS. 16 to 18, in the semiconductor memory device of Embodiment 4, the element formation region AR is formed in a profile of continuously extending along the first direction, and the bit line BL extends along the first direction, and the gate line GL, the word line WL, and the source line SL extend along the second direction. Then, the bit line BL is shared by a plurality of memory cells MC arranged side by side in the first direction, and the source line SL is shared by two memory cells MC adjacent to each other in the first direction.

Accordingly, when compared to the structure shown in FIG. 3, the area of the memory cell array region can be reduced, as much as the formation of the element isolation film 15 between the memory cells MC adjacent to each other in the first direction can be omitted. In addition, one source line SL is shared by the adjacent two memory cells MC in the first direction. Therefore, the area of the memory cell array region can be reduced.

Also, according to FIGS. 2 and 3, in the structure wherein the element isolation film 15 is formed between the memory cells MC adjacent to each other in the first direction, the parasitic capacitance structure is formed by the impurity diffusion region 24 of one of the memory cells MC, the element isolation film 15, and the impurity diffusion region 20 of the another memory cell MC. Therefore, it is necessary to be so designed that the separation width of the element isolation film 15 is increased to prevent current leak via the element isolation film 15 and the order of arrangement of the source lines SL and the bit lines BL is replaced so that the source lines SL of equal potential are adjacent to each other. Meanwhile, in the semiconductor memory device of Embodiment 4, the element isolation film 15 is not formed between the memory cells MC adjacent to each other in the first direction, and therefore the aforementioned design is not necessary.

In addition, as shown in FIGS. 30 and 31, the full trench type element isolation film 15 is formed in the memory cell array region, and the partial trench type element isolation film 140 is formed in the peripheral circuit region. Accordingly, it becomes possible to fix the potential of each body region of the NMOS and PMOS in the peripheral circuit region, while the memory cells MC adjacent to each other in the second direction are electrically completely separated by the element isolation film 15.

While the invention has been shown and described in detail, the foregoing description is in all aspects illustrative and not restrictive. It is therefore understood that numerous modifications and variations can be devised without departing from the scope of the invention.

The invention claimed is:

1. A semiconductor memory device comprising:
    a plurality of memory cells arranged in a matrix; and
    a gate line, a word line, a bit line to be selected based on an address signal and to supply a writing voltage to the memory cell to be written, and a source line to which a power supply potential is supplied, wherein
    each of said plurality of memory cells includes:
    a storage transistor having a first impurity region and a second impurity diffusion region opposed to each other through a first channel formation region, a first gate electrode formed above said first channel formation region, and a charge accumulation node formed below said first channel formation region; and
    an access transistor connected to said storage transistor in series, having said first impurity diffusion region, a third impurity diffusion region opposed to said first impurity diffusion region through a second channel formation region, and a second gate electrode formed above said second channel formation region,
    said second impurity diffusion region is connected to said source line, said third impurity diffusion region is connected to said bit line, said first gate electrode is connected to said gate line, and said second gate electrode is connected to said word line.

2. The semiconductor memory device according to claim 1, further comprising:
    an SOI substrate in which a semiconductor substrate, an insulating layer, and a semiconductor layer are laminated in this order, wherein
    said first to third impurity diffusion regions and said first and second channel formation regions are respectively formed in said semiconductor layer, and
    said charge accumulation node is constituted as a part of said semiconductor layer.

3. The semiconductor memory device according to claim 1, further comprising:
    an SOI substrate in which a semiconductor substrate, an insulating layer, and a semiconductor layer are laminated in this order, wherein
    said SOI substrate includes a memory cell array region formed with said plurality of memory cells, and a peripheral circuit region formed with a peripheral circuit,
    a first element isolation film having a bottom face that is brought into contact with an upper surface of said insulating layer is formed in said memory cell array region, and
    a second element isolation film having the bottom face that is not brought into contact with the upper surface of said insulating layer is formed in said peripheral circuit region.

* * * * *